(12) United States Patent
Yoshino et al.

(10) Patent No.: US 12,243,878 B2
(45) Date of Patent: Mar. 4, 2025

(54) ACTIVE MATRIX SUBSTRATE AND DISPLAY DEVICE

(71) Applicant: Sharp Display Technology Corporation, Kameyama (JP)

(72) Inventors: Hikaru Yoshino, Kameyama (JP); Satoshi Horiuchi, Kameyama (JP); Junichi Morinaga, Kameyama (JP)

(73) Assignee: SHARP DISPLAY TECHNOLOGY CORPORATION, Kameyama (JP)

(*) Notice: Subject to any disclaimer, the term of this patent is extended or adjusted under 35 U.S.C. 154(b) by 273 days.

(21) Appl. No.: 17/963,287

(22) Filed: Oct. 11, 2022

(65) Prior Publication Data
US 2023/0112631 A1 Apr. 13, 2023

(30) Foreign Application Priority Data

Oct. 12, 2021 (JP) .................................. 2021-167741
Aug. 2, 2022 (JP) .................................. 2022-123514

(51) Int. Cl.
| | | |
|---|---|---|
| G02F 1/1362 | (2006.01) | |
| G02F 1/1333 | (2006.01) | |
| G02F 1/1343 | (2006.01) | |
| G02F 1/1368 | (2006.01) | |
| H01L 27/12 | (2006.01) | |

(52) U.S. Cl.
CPC ...... *H01L 27/124* (2013.01); *G02F 1/134309* (2013.01); *G02F 1/136286* (2013.01); *G02F 1/1368* (2013.01); *H01L 27/1255* (2013.01); *G02F 1/133345* (2013.01)

(58) Field of Classification Search
CPC ............ G02F 1/1333; G02F 1/133345; G02F 1/13338; G02F 1/1343; G02F 1/134309; G02F 1/134363; G02F 1/134372; G02F 1/1362; G02F 1/136272; G02F 1/136286; G02F 1/1368; G02F 2201/56; G06F 3/04164; G06F 3/0446; G06F 3/0448;
(Continued)

(56) References Cited

U.S. PATENT DOCUMENTS

| | | | |
|---|---|---|---|
| 2010/0156945 A1 | 6/2010 | Yoshida | |
| 2019/0073976 A1 | 3/2019 | Yeh et al. | |

(Continued)

FOREIGN PATENT DOCUMENTS

| | | | |
|---|---|---|---|
| JP | 2019-049693 A | 3/2019 | |
| JP | 2019-070744 A | 5/2019 | |

(Continued)

*Primary Examiner* — Thoi V Duong
(74) *Attorney, Agent, or Firm* — Keating & Bennett, LLP

(57) ABSTRACT

An active matrix substrate includes a substrate in which a notch or an aperture is formed, and electrodes. Each electrode includes at least either of: a capacitor forming portion that is arranged in a region other than a bypass region and overlaps with at least one of a plurality of bypass gate lines when viewed in a plan view; and an electrode layer portion that is formed in an electrode layer and that composes a bypass gate line interposed portion together with a source line layer portion formed in a source line layer in the bypass region. The electrode layer portion and the source line layer portion overlap with at least one of the bypass gate lines in the bypass region when viewed in a plan view, and at least one of the bypass gate lines is positioned between the electrode layer portion and the source line layer portion in a normal line direction of the substrate.

20 Claims, 33 Drawing Sheets

(58) Field of Classification Search
CPC . H01L 27/124; H01L 27/1255; H04M 1/0266
See application file for complete search history.

(56) References Cited

U.S. PATENT DOCUMENTS

| | | |
|---|---|---|
| 2019/0107761 A1 | 4/2019 | Yasuda |
| 2019/0221585 A1 | 7/2019 | Tominaga et al. |
| 2019/0250478 A1 | 8/2019 | Horiuchi et al. |
| 2021/0028270 A1 | 1/2021 | Yokoyama et al. |

FOREIGN PATENT DOCUMENTS

| | | |
|---|---|---|
| WO | 2008/062575 A1 | 5/2008 |
| WO | 2017/213178 A1 | 12/2017 |
| WO | 2018/012455 A1 | 1/2018 |
| WO | 2019/187159 A1 | 10/2019 |

ACTIVE MATRIX SUBSTRATE AND DISPLAY DEVICE

This application claims the benefit of priority to Japanese Patent Application Number 2021-167741 filed on Oct. 12, 2021 and Japanese Patent Application Number 2022-123514 filed on Aug. 2, 2022. The entire contents of the above-identified applications are hereby incorporated by reference.

TECHNICAL FIELD

The present disclosure relates to an active matrix substrate, and a display device.

BACKGROUND ART

Conventionally, a display device including a display having a non-rectangular shape is known. Such a display device is disclosed in, for example, JP-A-2019-49693.

The display device disclosed in JP-A-2019-49693 includes a non-rectangular substrate having a notch. In addition, the display device has an active area from which light is emitted, and a non-active area from which light is not emitted. The display device includes a plurality of first gate lines that pass through the active area, the non-active area, and then, the active area in the stated order, and a plurality of second gate lines that pass through only the active area. The first gate lines bypass a notch when passing through the non-active area. Therefore, a distance between portions of the first gate lines in the non-active area is smaller than a distance between portions thereof in the active area. Each of the first gate lines is connected to a plurality of pixels in the active area. Each of the second gate lines is also connected to a plurality of pixels in the active area. Each of the first gate lines is connected to pixels the number of which is smaller than the number of pixels connected to the second gate lines. In addition, in this display device, a polysilicon layer is formed within the non-active area.

SUMMARY OF INVENTION

In the display device disclosed in JP-A-2019-49693, the first gate line has an increased capacitance due to the polysilicon layer provided in the non-active area, thereby causing the difference between the capacitance of the first gate line and the capacitance of the second gate line to be partially reduced. However, in the display device disclosed in JP-A-2019-49693, the distance between the portions of the first gate lines arranged in the non-active area is smaller than the distance between portions of the first gate lines arranged in the active area. This makes it impossible to form the polysilicon layer in such a manner that the size of a portion of the polysilicon layer per one gate line is sufficient, and the difference between the capacitance of the first gate line and the capacitance of the second gate line is not reduced sufficiently. This causes the following problem: a difference in waveforms of gate signals is caused by the difference between the capacitance of the first gate line and the capacitance of the second gate line, which leads to a difference between the luminance above the first gate line and the luminance above the second gate line, thereby deteriorating the display quality of the display device.

The present disclosure was made to solve the above-described problem, and it is an object thereof to provide an active matrix substrate and a display device in which the deterioration of display quality caused by differences in capacitances of a plurality of gate lines can be prevented.

To achieve the above-described object, a display device according to a first aspect of the present disclosure includes: a substrate in which a notch or an aperture is formed; a plurality of gate lines formed in a gate line layer on the substrate; a plurality of source lines formed in a source line layer that is a layer different from the gate line layer, the source lines being arranged to intersect with the gate lines when viewed in a plan view; and electrodes at least a part of which are formed in an electrode layer that is a layer different from any of the gate line layer and the source line layer, wherein the substrate includes a pixel region in which pixels defined by the gate lines and the source lines are formed; the substrate further includes a pixel adjacent region between the notch or the aperture and the pixel region, the pixel adjacent region being adjacent to the pixel region; the gate lines include a plurality of first gate lines that pass through the pixel adjacent region, and second gate lines that do not pass through the pixel adjacent region; a distance between the first gate lines in the pixel adjacent region is smaller than a distance between the first gate lines in the pixel region; each electrode include at least either of a capacitor forming portion that is arranged within the pixel region and overlaps with at least one of the first gate line when viewed in a plan view, and a first gate line interposed portion that is arranged in the pixel adjacent region and includes an electrode layer portion formed in the electrode layer and a source line layer portion formed in the source line layer; and the electrode layer portion and the source line layer portion overlap with at least one of the first gate lines in the pixel adjacent region when viewed in a plan view; and at least one of the first gate lines is positioned between the electrode layer portion and the source line layer portion in a normal line direction of the substrate.

In addition, an active matrix substrate according to the second aspect includes: a substrate in which a notch or an aperture is formed; a plurality of gate lines formed in a gate line layer on the substrate; a plurality of source lines formed in a source line layer that is a layer different from the gate line layer, the source lines being arranged to intersect with the gate lines when viewed in a plan view; and electrodes at least a part of which are formed in an electrode layer that is a layer different from any of the gate line layer and the source line layer, wherein the gate lines include a plurality of bypass gate lines that are bent or curved to bypass the notch or the aperture; the substrate includes a bypass region through which the bypass gate lines pass for bypassing, and in which a distance between the bypass gate lines is smaller than a distance between the bypass lines in a region other than the bypass region; each electrode includes at least either of a capacitor forming portion that is arranged in the region other than the bypass region and overlaps with at least one of the bypass gate lines when viewed in a plan view, and an electrode layer portion that is formed in the electrode layer and that composes a bypass gate line interposed portion together with a source line layer portion formed in the source line layer in the bypass region; and the electrode layer portion and the source line layer portion overlap with at least one of the bypass gate lines in the bypass region when viewed in a plan view, and at least one of the bypass gate lines is positioned between the electrode layer portion and the source line layer portion when viewed in a normal line direction of the substrate.

In the display device having a configuration in which the electrode includes the capacitor forming portion, the capacitor forming portion is formed at a position in the pixel region with a great distance between the first gate lines. Here, when the capacitor forming portions are provided with respect to predetermined ones of the first gate lines, the distance to the first gate line adjacent to the predetermined first gate line increases, which makes it possible to form the capacitor forming portion in a greater dimension in a direction orthogonal to a direction in which the predetermined first gate line extends (in the width direction). In addition, even when the capacitor forming portions are provided with respect to a plurality of the first gate lines, it is possible to increase a width-direction dimension of the capacitor forming portion per one first gate line, as compared with a case where electrodes are formed in the pixel adjacent region in which the distance between the first gate lines is small. As a result, large capacitors can be formed between the capacitor forming portions of the electrodes and the first gate lines. As a result, the difference between the capacitances of the first gate lines and the capacitances of the second gate lines among the gate lines can be reduced sufficiently, which makes it possible to prevent the display quality from deteriorating due to the difference between the capacitances of the first gate lines and the capacitances of the second gate lines. In addition, in the display device having a configuration in which the electrode includes the first gate line interposed portion, at least one of the first gate lines is positioned between the electrode layer portion and the source line layer portion of the first gate line interposed portion. This makes the distance between at least one of the first gate lines and the electrode layer portion smaller, and makes the distance between at least one of the first gate lines and the source line layer portion smaller. As a result, large capacitors can be formed between the first gate line interposed portion of the electrode and at least one of the first gate lines, even in the pixel adjacent region where the distance between the first gate lines is small. As a result, the difference between the capacitances of the first gate lines and the capacitances of the second gate lines among the gate lines can be reduced sufficiently, which makes it possible to prevent the display quality from deteriorating due to the difference between the capacitances of the first gate lines and the capacitances of the second gate lines.

BRIEF DESCRIPTION OF DRAWINGS

FIG. 5B is a schematic diagram for explaining a bypass region R2a.

MODE FOR CARRYING OUT THE INVENTION

Figure 1:
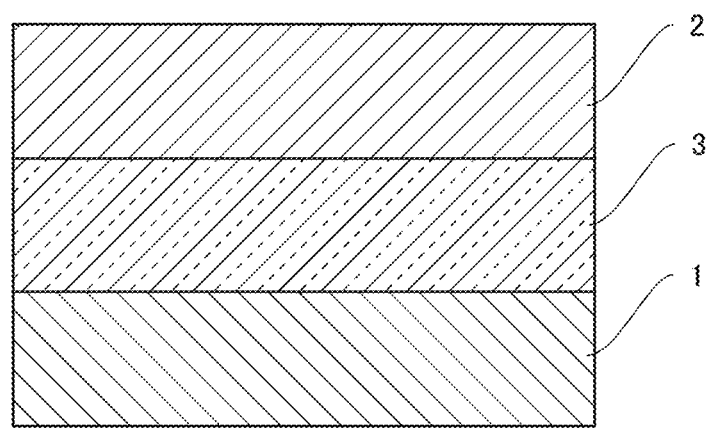
FIG. 1 is a cross-sectional view schematically illustrating a configuration of a display device 100 in Embodiment 1.

The following description describes Embodiments of the present disclosure based on the drawings. The present disclosure is not limited by the embodiments described below, but design changes can be made appropriately as long as they are in accordance with the configuration of the present disclosure. In addition, in the description below, identical parts or parts having identical functions are denoted by identical reference marks commonly in different drawings, and repetitive descriptions of the parts are omitted. Further, configurations described in Embodiments and Modification Examples may be used in combination appropriately or may be changed without deviating the scope of the present disclosure. To make the description easy to understand, in the drawings referred to hereinafter, the configurations are simply illustrated or schematically illustrated, or the illustration of part of constituent members is omitted. Further, dimension ratios of constituent members illustrated in the drawings do not necessarily indicate actual dimension ratios.

Embodiment 1

Figure 2:
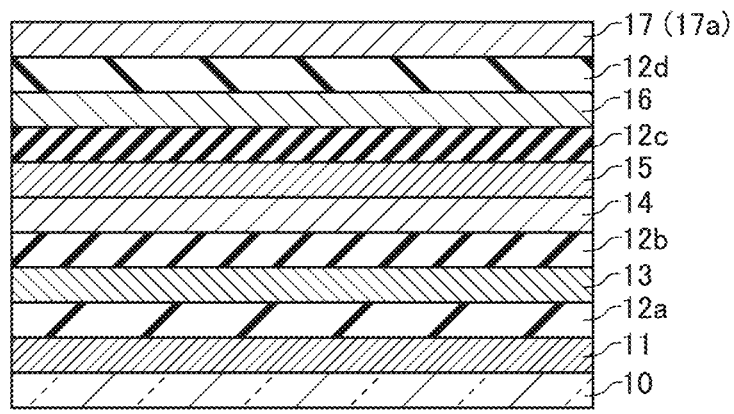
FIG. 2 is a cross-sectional view schematically illustrating a configuration of an active matrix substrate 1 in Embodiment 1.
Figure 3A:
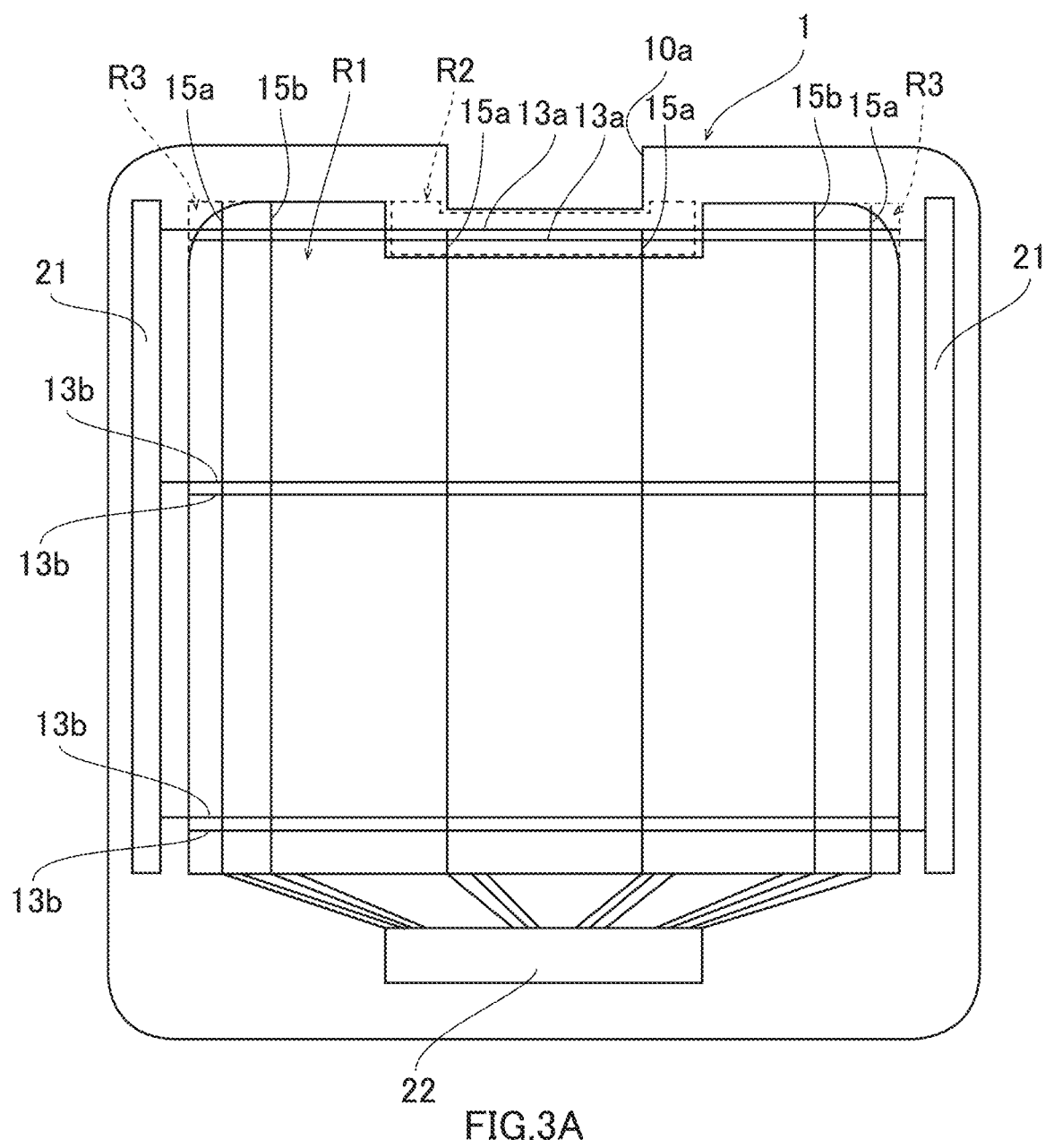
FIG. 3A is a schematic plan view for explaining the configuration of the active matrix substrate 1.
Figure 3B:
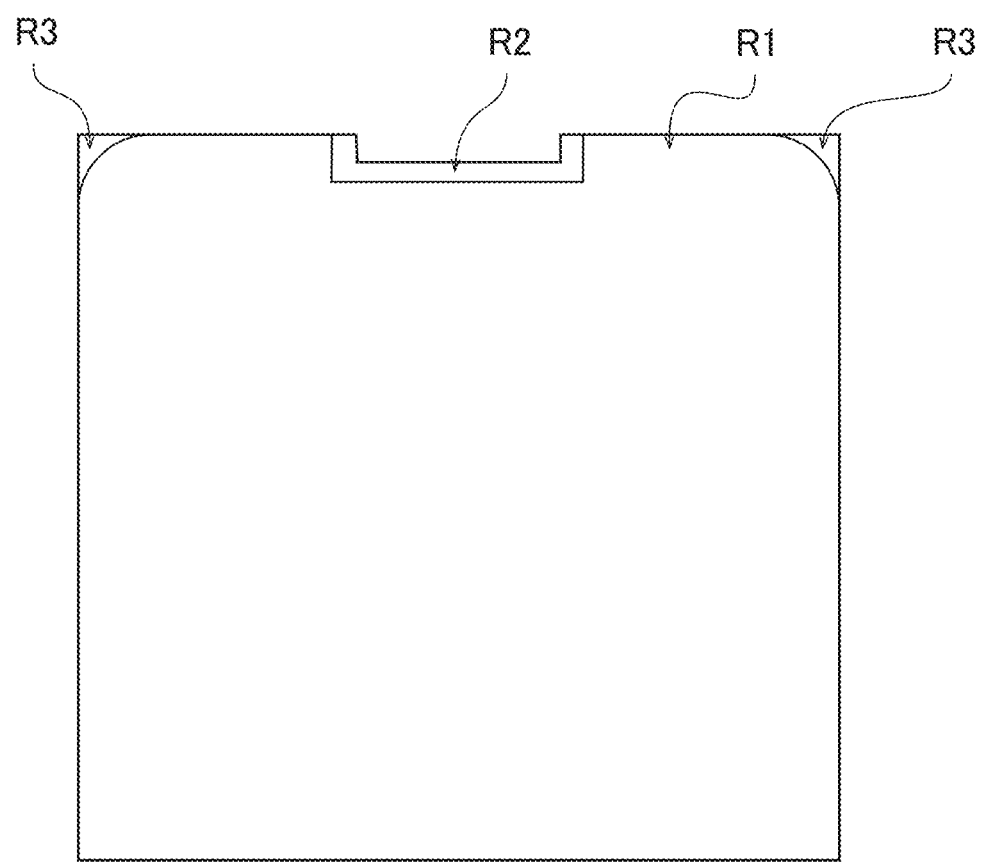
FIG. 3B is a schematic diagram for explaining a configuration of a pixel region R1.

FIG. 1 is a cross-sectional view schematically illustrating a configuration of a display device 100 in Embodiment 1. FIG. 2 is a cross-sectional view schematically illustrating a configuration of an active matrix substrate 1 in Embodiment 1. FIG. 3A is a schematic plan view for explaining the configuration of the active matrix substrate 1. FIG. 3B is a schematic diagram for explaining a configuration of a pixel region R1.

The display device 100 is, for example, a liquid crystal display device of a horizontal electric field type. As shown in FIG. 1, the display device 100 includes an active matrix substrate 1, a counter substrate 2, and a liquid crystal layer 3. The liquid crystal layer 3 is arranged between the active matrix substrate 1 and the counter substrate 2.

As illustrated in FIG. 2, in the active matrix substrate 1, the following are laminated in the stated order: a glass substrate 10; an electrode layer 11; a lower insulating layer 12a; a gate line layer 13; a gate insulating layer 12b; a semiconductor layer 14; a source line layer 15; a first insulating layer 12c; a pixel electrode layer 16; a second insulating layer 12d; and a common electrode layer 17. The electrode layer 11, the gate line layer 13, and the source line layer 15 contain a metal material such as copper or aluminum. The lower insulating layer 12a, the gate insulating layer 12b, the first insulating layer 12c, and the second insulating layer 12d, are formed with an insulating material containing an inorganic material or an organic material. The pixel electrode layer 16 and the common electrode layer 17 are formed with transparent conductive films such as indium tin oxide (ITO) films, or mesh-type metal films. In addition, on the active matrix substrate 1, a plurality of common electrodes 17a (see FIG. 7B) are formed in the common electrode layer 17. The common electrodes 17a are arranged to be opposed, in a normal line direction of the active matrix substrate 1, to a plurality of the pixel electrodes 16a (see FIG. 6).

As illustrated in FIG. 3A, on the active matrix substrate 1, a pixel region R1 is provided in which pixels are arranged, the pixels being defined by a plurality of first gate lines 13a (bypass gate lines) or a plurality of second gate lines 13b (non-bypass gate lines), and a plurality of first source lines 15a or second source lines 15b. In Embodiment 1, a notch portion 10a is formed that is recessed from an upper edge of the glass substrate 10 toward the inside. The pixel region R1 includes a recessed portion that is recessed from the upper edge toward the inside, along the notch portion 10a. Incidentally, in the notch portion 10a, equipment such as a camera, a microphone, or a speaker, not shown, is arranged.

As shown in FIGS. 3A and 3B, a pixel adjacent region R2 that is adjacent to the pixel region R1 and the notch portion 10a is provided in a region between the pixel region R1 and the notch portion 10a. The pixel adjacent region R2 is formed in a recess form when viewed in a plan view, along an inner surface of the notch portion 10a. The pixel adjacent region R2 is a region that does not contribute to display, and the transistors 23 or the pixel electrodes 16a are not formed therein in some cases, though the first gate lines 13a or the first source lines 15a are formed in the area. Incidentally, the configuration may be such that transistors 23 or pixel electrodes 16a are formed and pixels that are not driven (do not function) as pixels (that is, dummy pixels) are arranged in the pixel adjacent region R2. In a case where dummy pixels are arranged in the pixel adjacent region R2, as a method for causing the dummy pixels not to be driven (causing no image to be displayed on the dummy pixels), the following methods may be used, for example: avoiding forming the liquid crystal layer 3 at positions that overlap with the dummy electrodes when viewed in a plan view; avoiding connecting the transistors 23 of the dummy pixels with the first gate lines 13a; avoiding arranging at least either of the transistors 23 and the pixel electrodes 16a in the dummy pixels; and covering the dummy pixels with a black matrix 20a. Incidentally, the pixel adjacent region R2 is a region in which the black matrix 20a is arranged.

In addition, corner regions R3 are provided at positions adjacent to two corners in an upper part of the pixel region R1. In the corner regions R3, the first gate lines 13a and the first source lines 15a are formed. The corner regions R3 are also regions that do not contribute to display, as is the case with the pixel adjacent region R2, and the transistors 23 or the pixel electrodes 16a do not have to be formed therein, though the first gate lines 13a or the first source lines 15a are formed in the area, or the dummy pixels described above may be formed therein.

In addition, as illustrated in FIG. 3A, on the active matrix substrate 1, the following are formed: a plurality of the first gate lines 13a passing through the pixel region R1, the pixel adjacent region R2, and the corner regions R3; a plurality of the second gate lines 13b passing through only the pixel region R1; a plurality of the first source lines 15a passing through the pixel region R1, and the pixel adjacent region R2 or the corner regions R3; and a plurality of the second source lines 15b passing through only the pixel region R1. The first gate lines 13a and the second gate lines 13b are formed within the gate line layer 13. The first source lines 15a and the second source lines 15b are formed within the source line layer 15. In addition, on the active matrix substrate 1, two gate driving circuits 21 and a source driving circuit 22 are arranged.

As shown in FIG. 3A, the two gate driving circuits 21 are arranged on the left side as viewed on the surface of the sheet carrying FIG. 3A (hereinafter referred to as the sheet surface) with respect to the pixel region R1, and on the right side as viewed on the sheet surface with respect to the pixel region R1, respectively. The source driving circuits 22 is arranged on the lower side as viewed on the sheet surface with respect to the pixel region R1. Each of the first gate lines 13a is connected to either of the two gate driving circuits 21. Each of the second gate lines 13b is connected to either of the two gate driving circuits 21. Here, each of the first gate lines 13a and the second gate lines 13b is formed extending leftward or rightward on the sheet surface from the gate driving circuits 21. The first source lines 15a and the second source lines 15b are formed crossing at right angles with the first gate lines 13a and the second gate lines 13b when viewed in a plan view.

Figure 4:
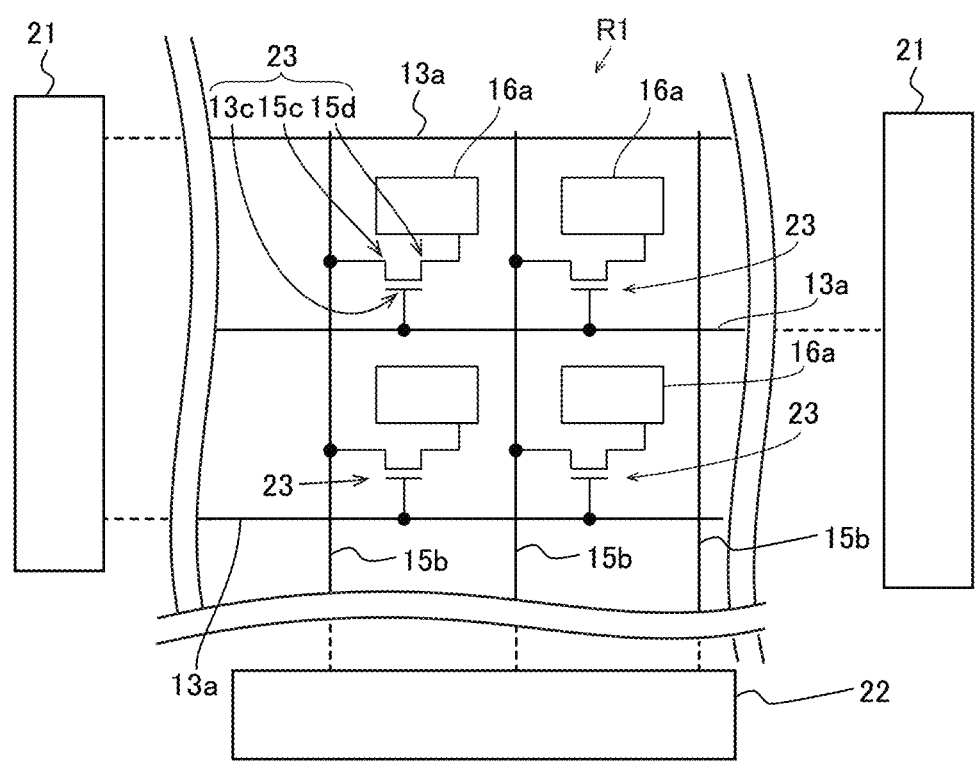
FIG. 4 is a diagram for explaining a configuration of pixel electrodes 16a and transistors 23 in the pixel region R1.

FIG. 4 is a diagram for explaining a configuration of pixel electrodes 16a and transistors 23 in the pixel region R1. As shown in FIG. 4, a pixel electrode 16a and a transistor 23 are formed in each of the plurality of pixels. The transistor 23 includes a gate electrode 13c formed in the gate line layer 13, as well as a source electrode 15c and a drain electrode 15d formed in the source line layer 15. The gate electrode 13c is connected to the first gate line 13a. The source electrode 15c is connected to the second source line 15b. The drain electrode 15d is connected to the pixel electrode 16a. The pixel electrode 16a is formed in the pixel electrode layer 16.

As no pixel contributing to display is formed in the pixel adjacent region R2 and the corner regions R3, the number of pixels connected to the first gate lines 13a (pixels contributing to display) is smaller than the number of pixels connected to the second gate lines 13b. As a result, the capacitance of the first gate line 13a is smaller than the capacitance of the second gate line 13b.

Here, when the potential of the first gate line and the potential of the second gate line switch from an ON-potential to an OFF-potential, a change of the potential of the pixel electrode (field-through voltage) occurs. When the first and second gate lines have a capacitance difference (load difference) therebetween, a difference occurs to the waveforms of the gate signals. In this case, a difference occurs to the field through voltages, leading to a difference between the luminance above the first gate line and the luminance above the second gate line, which could cause a deterioration of the display quality of the display device. In particular, at a boundary part between a region where the first gate lines are arranged and a region where the second gate lines are arranged, an image could possibly be visualized as if being divided, thereby becoming a brick-pattern image. the "brick-pattern image" and "brick-pattern display" mean that the boundary between the region where the first gate lines are arranged and the region where the second gate lines are arranged is observed, caused by the difference between the luminance of the region where the first gate lines are arranged and the luminance of the region where the second gate lines are arranged.

To cope with this, in Embodiment 1, as is described below, the electrodes 30 compensate capacitances of the first gate lines 13a, reducing differences between the capacitances of the first gate lines 13a and the capacitances of the second gate lines 13b, which prevents the deterioration of display quality. Besides, the number of pixels connected to the first source lines 15a is smaller than the number of pixels connected to the second source lines 15b. This makes the capacitance of the first source line 15a smaller than the capacitance of the second source line 15b. To cope with this, in Embodiment 1, as is described below, the electrodes 30 compensate capacitances of the first source lines 15a, reducing differences between the capacitances of the first source lines 15a and the capacitances of the second source lines 15b.

Figure 5A:
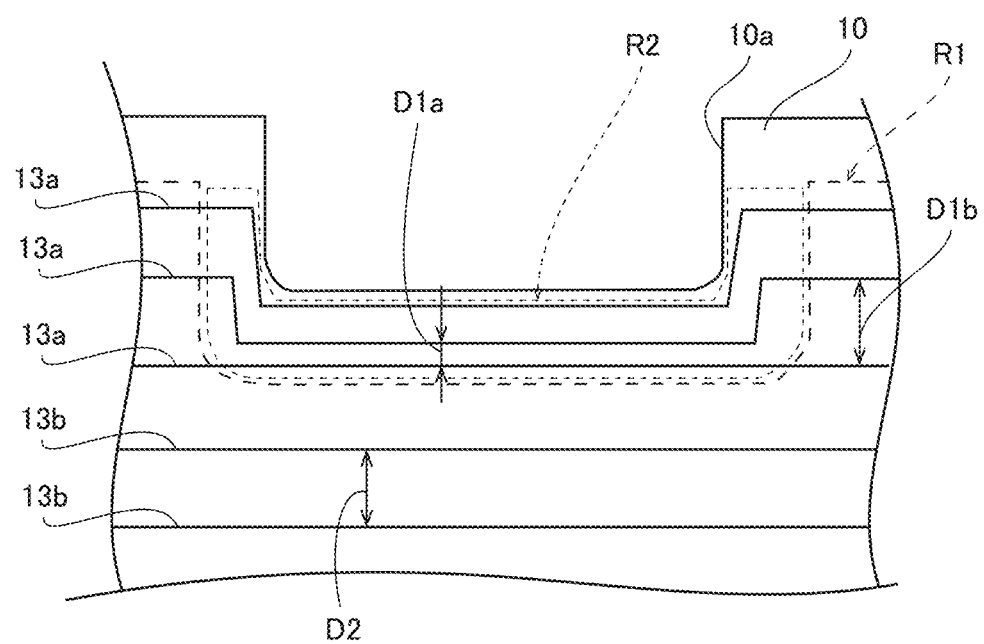
FIG. 5A is a schematic diagram for explaining distances between a plurality of first gate lines 13a and distances between a plurality of second gate lines 13b in a pixel adjacent region R2.
Figure 5B:
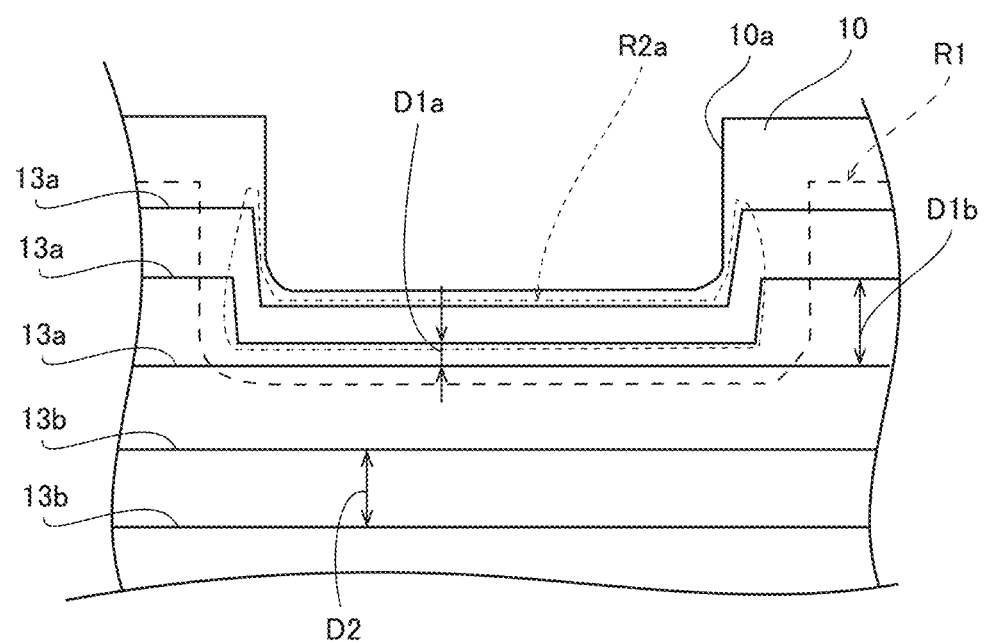

FIG. 5A is a schematic diagram for explaining distances between a plurality of first gate lines 13a and distances between a plurality of second gate lines 13b in a pixel adjacent region R2. FIG. 5B is a schematic diagram for explaining a bypass region R2a. As shown in FIG. 5A, at least some of the first gate lines 13a are formed along the notch portion 10a, to bypass the notch portion 10a. In other words, the first gate lines 13a are bent or curved to bypass the notch portion 10a. This makes a distance D1a between the first gate lines 13a in the pixel adjacent region R2 smaller than a distance D1b between the first gate lines 13a in the pixel region R1. In addition, the distance D1a between the first gate lines 13a in the pixel adjacent region R2 is smaller than a distance D2 between the second gate lines 13b. The distance D1b is, for example, equal to the distance D2. Incidentally, the "distance" between a plurality of lines means a minimal value of a distance between these lines in the direction orthogonal to the direction in which the lines extend. Here, a region in the pixel adjacent region R2 in which the first gate lines 13a are bent or curved to bypass the notch portion 10a is referred to as a bypass region R2a. In the case of FIG. 5B, the bypass region R2a is a region in which portions of the first gate lines 13a that are bent or curved downward as viewed on the sheet surface are arranged.

Configuration of Electrode

Figure 6:
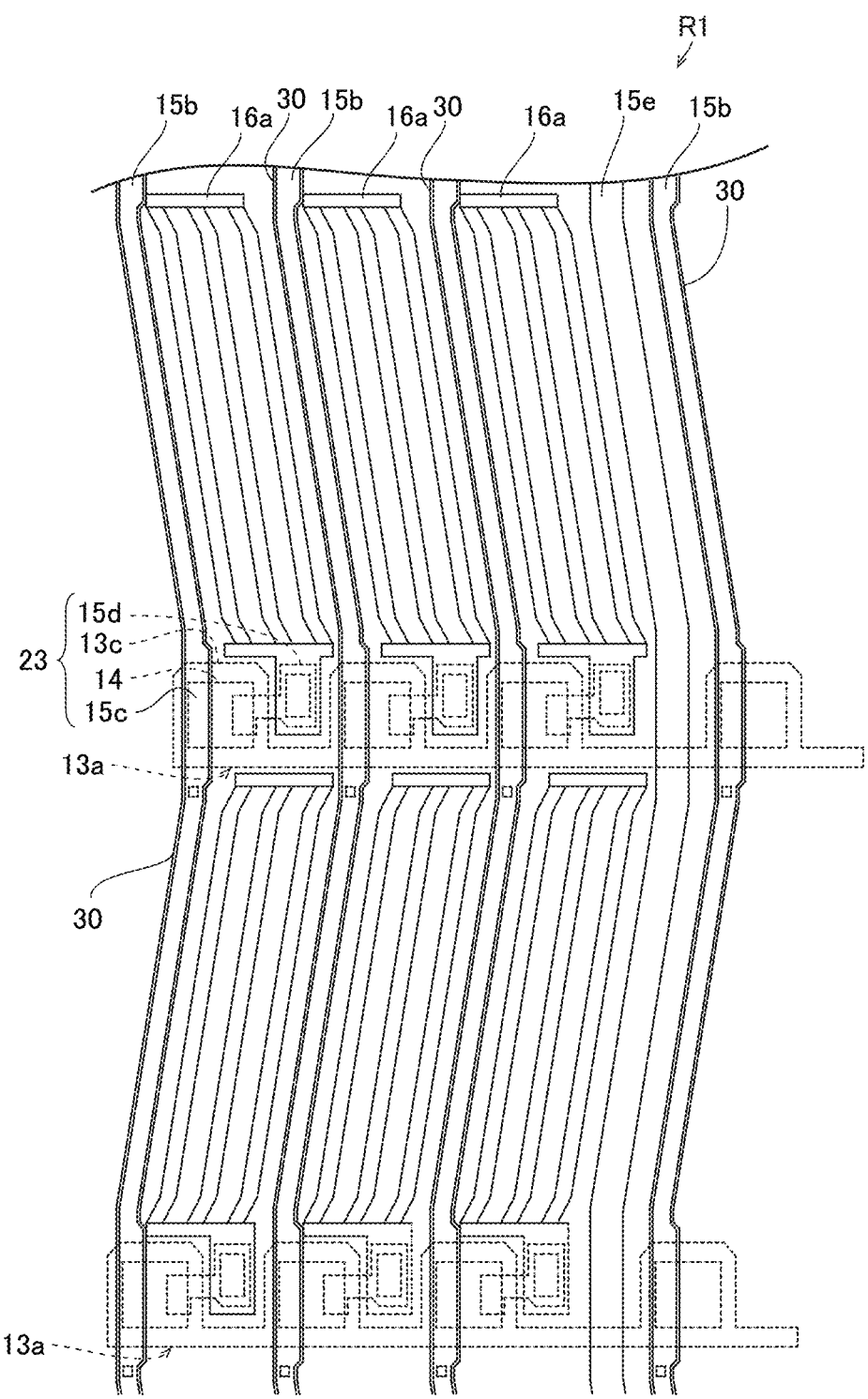
FIG. 6 is a schematic plan view for explaining a configuration of transistors 23 and electrodes 30 arranged in the pixel region R1.
Figure 7A:
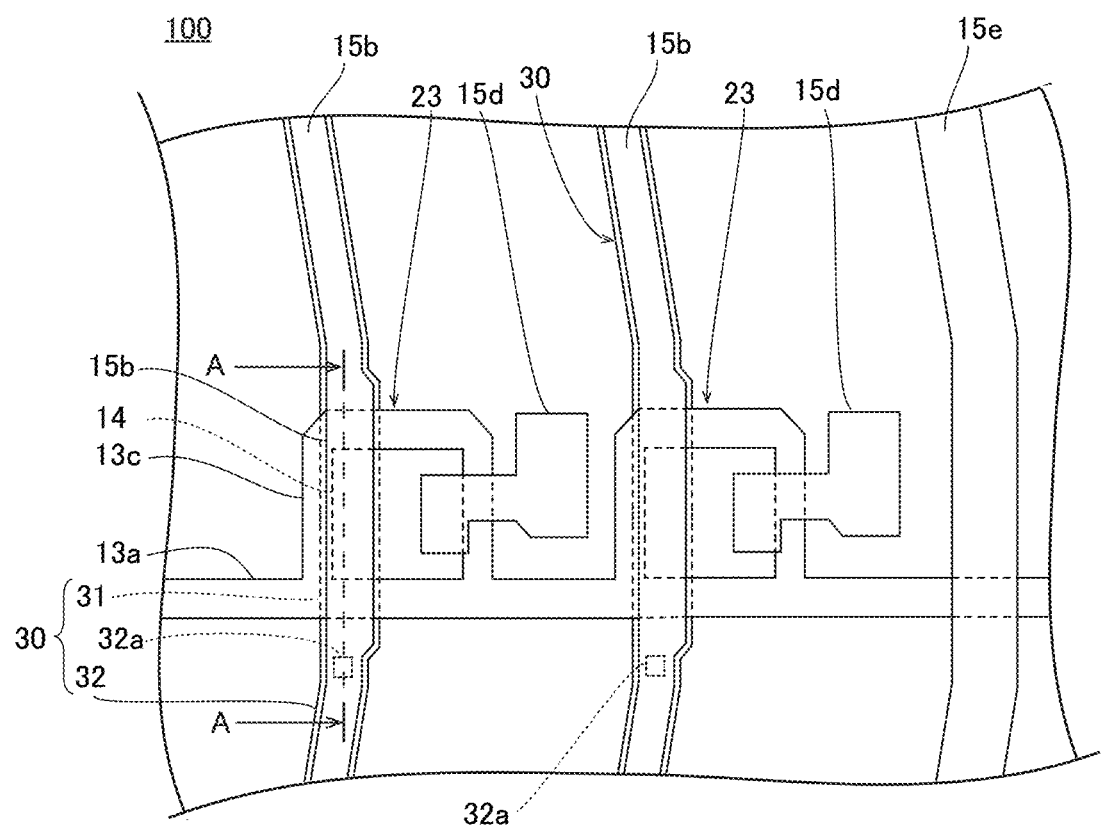
FIG. 7A is a diagram for explaining a configuration of electrodes 30.
Figure 7B:
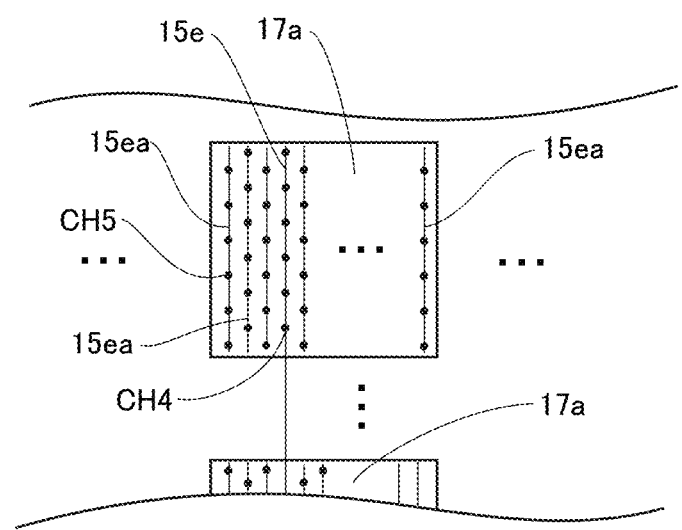
FIG. 7B is a schematic diagram for explaining connection of common electrodes 17a, touch sensor lines 15e, and dummy touch sensor lines 15ea.
Figure 8:
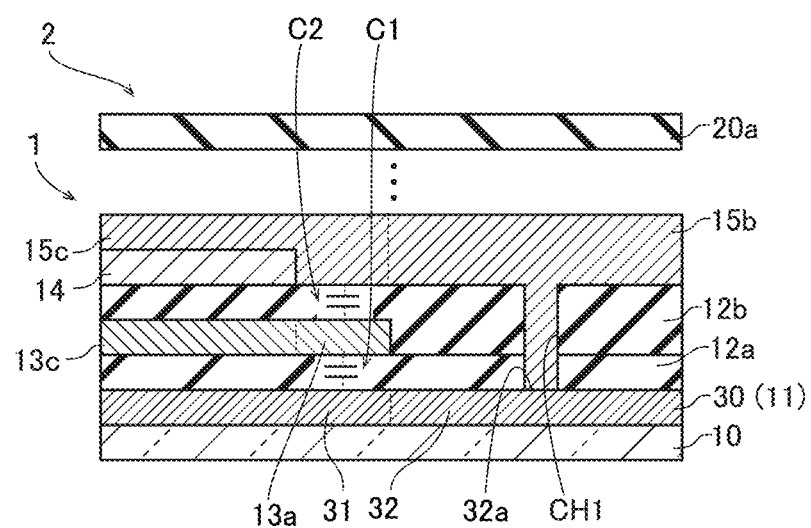
FIG. 8 is a cross-sectional view of a display device 100 taken along a part where an electrode 30 is arranged.

FIG. 6 is a schematic plan view for explaining a configuration of transistors 23 and electrodes 30 arranged in the pixel region R1. FIG. 7A is a diagram for explaining a configuration of electrodes 30. FIG. 7B is a schematic diagram for explaining connection of common electrodes 17a, touch sensor lines 15e, and dummy touch sensor lines 15ea. FIG. 8 is a cross-sectional view of a display device 100 taken along a part where an electrode 30 is arranged. As shown in FIG. 6, the active matrix substrate 1 includes electrodes 30. As shown in FIG. 7A, the electrodes 30 are arranged at positions that overlap with the first gate lines 13a when viewed in a plan view, respectively, and include first capacitor forming portions 31 that, together with the first gate lines 13a, form capacitors (hereinafter the portions are referred to as "first portions 31"). FIG. 7A shows the first portion 31 arranged in correspondence with one first gate line 13a, but the first portions 31 are arranged with respect to a plurality of the first gate lines 13a, respectively.

As shown in FIG. 8, the electrode 30 is formed in the electrode layer 11. The electrode layer 11 is formed below the gate line layer 13 in which the first gate lines 13a are formed, and below the source line layer 15 in which the second source lines 15b are formed. With this configuration, the first portions 31 of the electrodes 30, forming capacitors together with the first gate lines 13a, respectively, and second capacitor forming portions 32, which are described below, are formed at positions in the pixel region R1 with a great distance D1b between the first gate lines 13a. This makes it possible to increase a width-direction (direction orthogonal to the direction in which the first gate lines 13a extend) dimension of the electrode 30 per one first gate line 13a, as compared with a case where electrodes are formed in the pixel adjacent region R2 that is adjacent to the notch portion 10a of the active matrix substrate 1 and in which the distance D1a between the first gate lines 13a is small. As a result, large capacitors C1 can be formed between the electrodes 30 and the first gate lines 13a.

In addition, as shown in FIG. 8, each first gate line 13a is interposed between the first portion 31 of the electrode 30 and the second source line 15b. As a result, a capacitor C1 is formed between the first gate line 13a and the first portion 31, and a capacitor C2 is formed between the first gate line 13a and the second source line 15b. As a result, the capacitance of the first gate line 13a increases, whereby the difference between the capacitance of the first gate line 13a and the capacitance of the second gate line 13b decreases. Incidentally, though the illustration is omitted, the electrode 30 is formed in the electrode layer 11 in the pixel adjacent region R2 and the corner regions R3, similarly in the pixel region R1. This causes the capacitance of the first source line 15a to increase, thereby reducing the difference between the capacitance of the first source line 15a and the capacitance of the second source line 15b. Incidentally, in addition to the electrodes 30, lines (such as lines for leading to terminals or the like), which are not shown, may be formed in the electrode layer 11.

In addition, as shown in FIG. 8, the counter substrate 2 is provided with a black matrix 20a (light-shielding member) that shields light. At least a part of the black matrix 20a is formed at a position that overlaps with the first gate lines 13a and the second source lines 15b when viewed in a plan view. In addition, the black matrix 20a is not arranged at a position that overlaps with the pixel electrodes 16a (see FIG. 6). In Embodiment 1, the electrodes 30 are formed at positions that overlap with the black matrix 20a when viewed in a plan view. This makes it possible to prevent the aperture ratio of the pixels from lowering, as compared with a case where the electrodes 30 are arranged in regions (openings) that allows light to pass therethrough.

In addition, as shown in FIG. 7A, the electrodes 30 are arranged at positions that overlap with the second source lines 15b when viewed in a plan view. Each electrode 30 includes a second capacitor forming portion 32 (hereinafter referred to as a "second portion 32") extending along the second source line 15b. With the second portion 32 thus provided, the electrode 30 has a larger area as compared with a case where the electrode is composed only with the first portion 31. Therefore, the effect of increasing the capacitance of the first gate line 13a, achieved by the electrode 30, can be enhanced. In addition, as shown in FIG. 8, each second portion 32 includes a source line connection part 32a connected to the second source line 15b at a position that does not overlap with the first gate lines 13a when viewed in a plan view. A part of the second source line 15b is formed in a contact hole CH1 formed in the lower insulating layer 12a and the gate insulating layer 12b. The second source line 15b and the source line connection part 32a are connected to each other inside the contact hole CH1. In addition, the second portion 32 is connected with the first portion 31. This makes it possible to cause the electrode 30 and the second source line 15b to have the same potential, which makes it possible to still further increase a capacitance of a capacitor formed between the electrode 30 and the first gate line 13a as well as a capacitance of a capacitor formed between the electrode 30 and the second source line 15b.

In addition, as shown in FIG. 7A, on the active matrix substrate 1, touch sensor lines 15e are formed extending in parallel with the second source lines 15b. The touch sensor lines 15e are formed, for example, in the source line layer 15.

As shown in FIG. 7B, the touch sensor lines 15e are connected to the common electrodes 17a. For example, the touch sensor lines 15e are connected to the common electrodes 17a through contact holes CH4, at a plurality of positions that overlap with the common electrodes 17a when viewed in a plan view. In addition, on the active matrix substrate 1, a plurality of dummy touch sensor lines 15ea are arranged to extend in parallel with the touch sensor lines 15e. The dummy touch sensor lines 15ea are formed in the same layer as the layer where the touch sensor lines 15e are formed (for example, in the source line layer 15). The touch sensor lines 15e and the dummy touch sensor lines 15ea are made of a metal material such as copper or aluminum. The dummy touch sensor lines 15ea are connected to the common electrodes 17a through contact holes CH5, at a plurality of positions that overlap with the common electrodes 17a when viewed in a plan view. The touch sensor lines 15e and the dummy touch sensor lines 15ea are common electrode lines connected to the common electrodes 17a, but the touch sensor lines 15e are connected to a control circuit, not shown, whereas the dummy touch sensor lines 15ea are not directly connected to any control circuit. To the dummy touch sensor lines 15ea, signals from the control circuit are supplied via the touch sensor lines 15e and the common electrodes 17a, and the dummy touch sensor lines 15ea have a function of making the distribution of electric capacities in the common electrodes 17a uniform. Signals for touch detection are supplied to the common electrodes 17a via the touch sensor lines 15e from the control circuit, and the control circuit receives the signals. With this configuration of the display device 100, the presence and position of an indicator that touches the display device 100 are detected. In other words, in Embodiment 1, the display device 100 is configured as a touch panel.

Modification Example 1 of Embodiment 1

Next, a configuration of a display device 200 according to Modification Example 1 of Embodiment 1 is described with reference to FIG. 9. In Embodiment 1, the first portions 31 of the electrodes 30 are formed at positions that overlap with the transistors 23 when viewed in a plan view, but in Modification Example 1, first capacitor forming portions 231 (hereinafter referred to as "first portions 231") of electrodes 230 are formed at positions that at least partially do not overlap with the transistors 23 when viewed in a plan view. Incidentally, the same constituent members as those in Embodiment 1 are denoted by the same reference symbols as those in Embodiment 1, and descriptions of the same are omitted.

Figure 9:
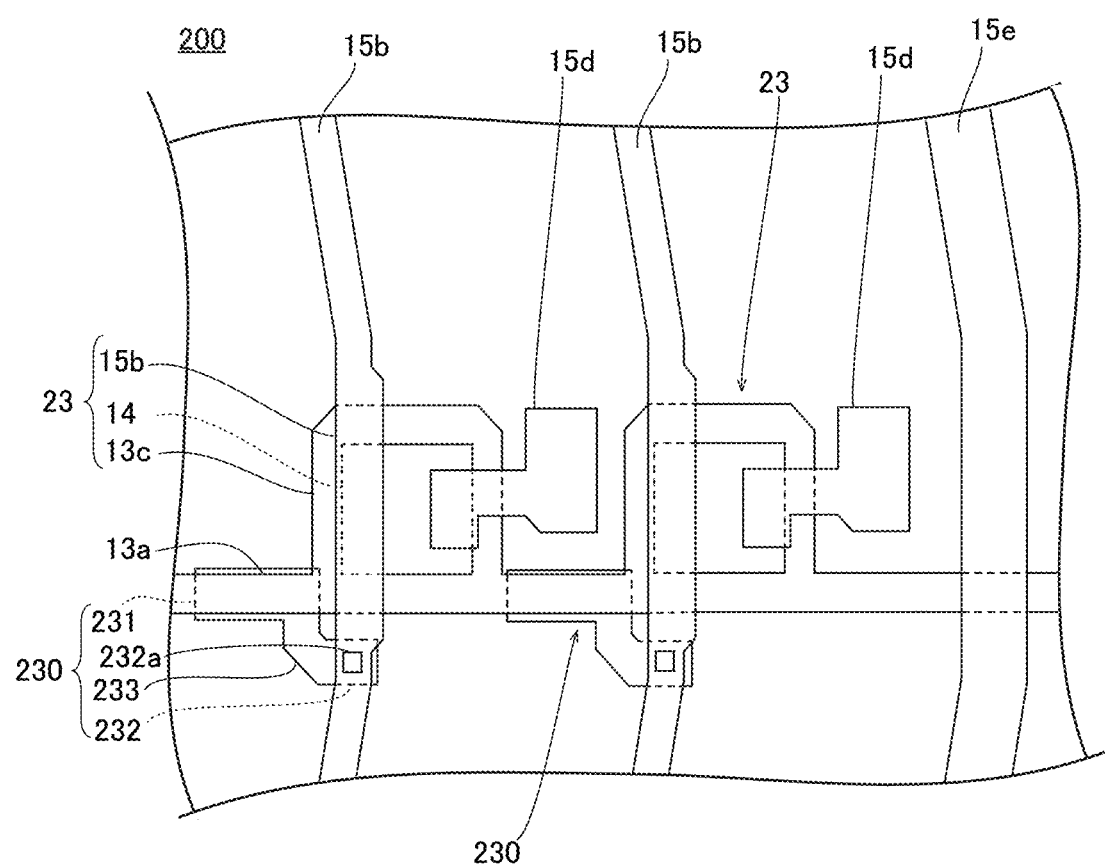
FIG. 9 illustrates a configuration of an electrode 230 of a display device 200 according to Modification Example 1 of Embodiment 1.

FIG. 9 illustrates a configuration of an electrode 230 of a display device 200 according to Modification Example 1 of Embodiment 1. Each electrode 230 includes the first portion 231, a second capacitor forming portion 232 (hereinafter referred to as a "second portion 232"), and a connection portion 233 that connects the first portion 231 and the second portion 232. The first portions 231 are arranged at positions that overlap with the first gate lines 13a and do not overlap with the second source lines 15b when viewed in a plan view. Further, the first portions 231 are formed at positions that at least partially do not overlap with the transistors 23 when viewed in a plan view. This configuration makes it possible to prevent properties of the transistors 23 from changing when the electrodes 30 are formed.

The second portions 232 are formed at positions that do not overlap with the transistors 23 when viewed in a plan view and that overlap with the second source lines 15b when viewed in a plan view. Each second portion 232 includes a connection point 232a through which it is connected to the second source line 15b via a contact hole. Further, the connection portions 233 are arranged at positions that do not overlap with the transistors 23 when viewed in a plan view, and extend to the first portion 231 and to the second portion 232. In addition, at least a part of each electrode 230 is formed at a position that overlaps with the black matrix 20a (see FIG. 8) of the counter substrate 2 when viewed in a plan view, in order to prevent the aperture ratio of the pixels from lowering. Incidentally, when each electrode 230 partially overlaps with the opening of each pixel, an electrode having the same shape as that of the electrode 230 is formed with respect to the second gate line 13b, whereby it is possible to prevent the visualization of the difference between the aperture ratio of the pixels to which the first gate lines 13a are connected and the aperture ratio of the pixels to which the second gate lines 13b are connected. In this case, as the electrodes having the same shape as that of the electrodes 230 are not required to increase the capacitances of the second gate lines 13b, the electrodes do not have to be connected with the second source lines 15b. Incidentally, the other configuration and effect of Modification Example 1 of Embodiment 1 are identical to the configuration and effect of Embodiment 1.

Modification Example 2 of Embodiment 1

Next, a configuration of a display device 300 according to Modification Example 2 of Embodiment 1 is described with reference to FIG. 10. In Embodiment 1, the second portion 32 of each electrode 30 is formed at a position that overlaps with the second source line 15b when viewed in a plan view, but in Modification Example 2, a third capacitor forming portion 332 (hereinafter referred to as a "third portion 332") of each electrode 330 is formed at a position that overlaps with the touch sensor line 15e when viewed in a plan view. Incidentally, the same constituent members as those in Embodiment 1 are denoted by the same reference symbols as those in Embodiment 1, and descriptions of the same are omitted.

Figure 10:
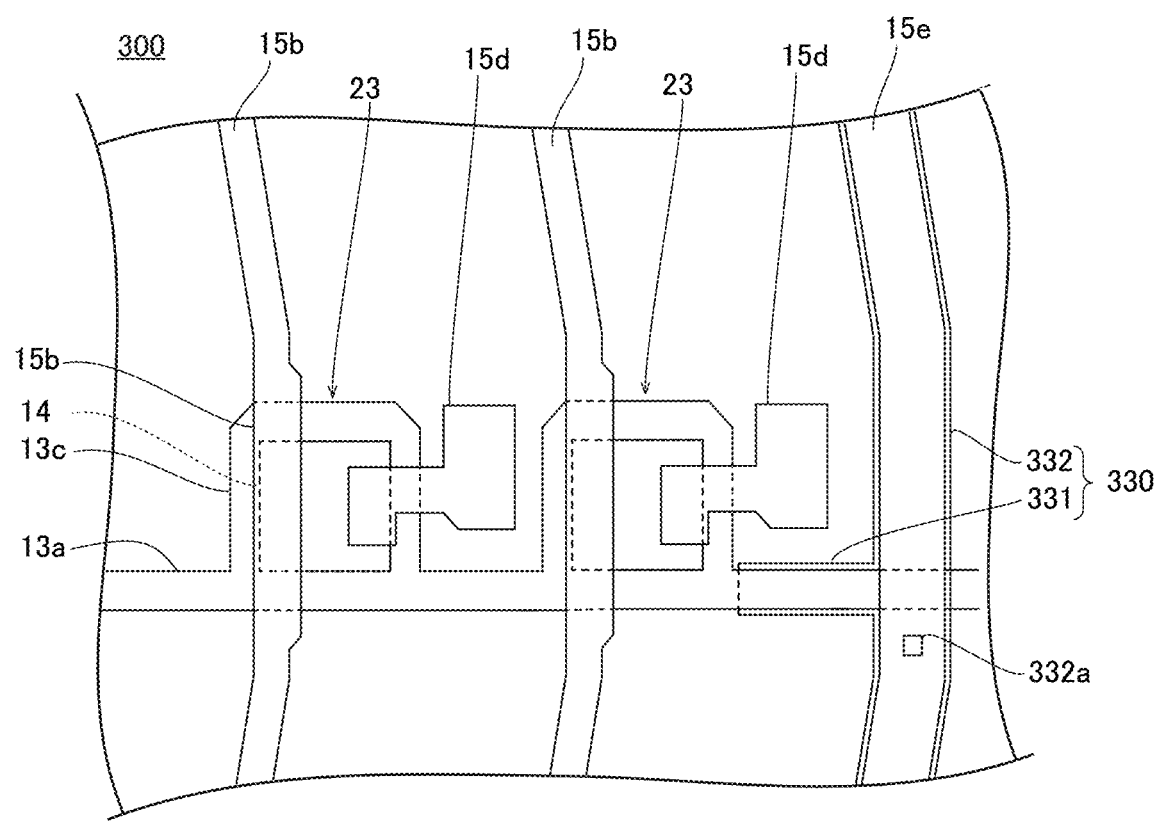
FIG. 10 illustrates a configuration of an electrode 330 of a display device 300 according to Modification Example 2 of Embodiment 1.

FIG. 10 illustrates a configuration of the electrode 330 of the display device 300 according to Modification Example 2 of Embodiment 1. Each electrode 330 includes a first capacitor forming portion 331 (hereinafter referred to as a "first portion 331"), and the third portion 332. The first portion 331 is arranged at a position that overlaps with the first gate line 13a and does not overlap with the transistors 23 when viewed in a plan view.

In addition, each third portion 332 is formed at a position that overlaps with the touch sensor line 15e when viewed in a plan view. The third portions 332 are formed along a direction in which the touch sensor lines 15e extend. At a position where the touch sensor line 15e and the first gate line 13a intersect when viewed in a plan view, the first portion 331 and the third portion 332 are connected with each other. In addition, the third portion 332 includes a connection point 332a at which the third portion 332 is connected to the touch sensor line 15e via a contact hole, at a position that does not overlap with the first gate lines 13a when viewed in a plan view. With this configuration, the effect of increasing the capacitance of the first gate line 13a, achieved by the electrode 330, can be enhanced. Incidentally, the other configuration and effect of Modification Example 2 of Embodiment 1 are identical to the configuration and effect of Embodiment 1.

Modification Example 3 of Embodiment 1

Next, a configuration of a display device 400 according to Modification Example 3 of Embodiment 1 is described with reference to FIG. 11. The display device 400 of Modification Example 3 of Embodiment 1 is provided with electrodes 430, obtained by combining the electrodes 30 of Embodiment 1 and the electrodes 230 of Modification Example 1, as well as the electrodes 330 of Modification Example 2. Incidentally, the same constituent members as those in Embodiment 1, Modification Example 1, or Modification Example 2 are denoted by the same reference symbols as those described above, and descriptions of the same are omitted.

Figure 11:
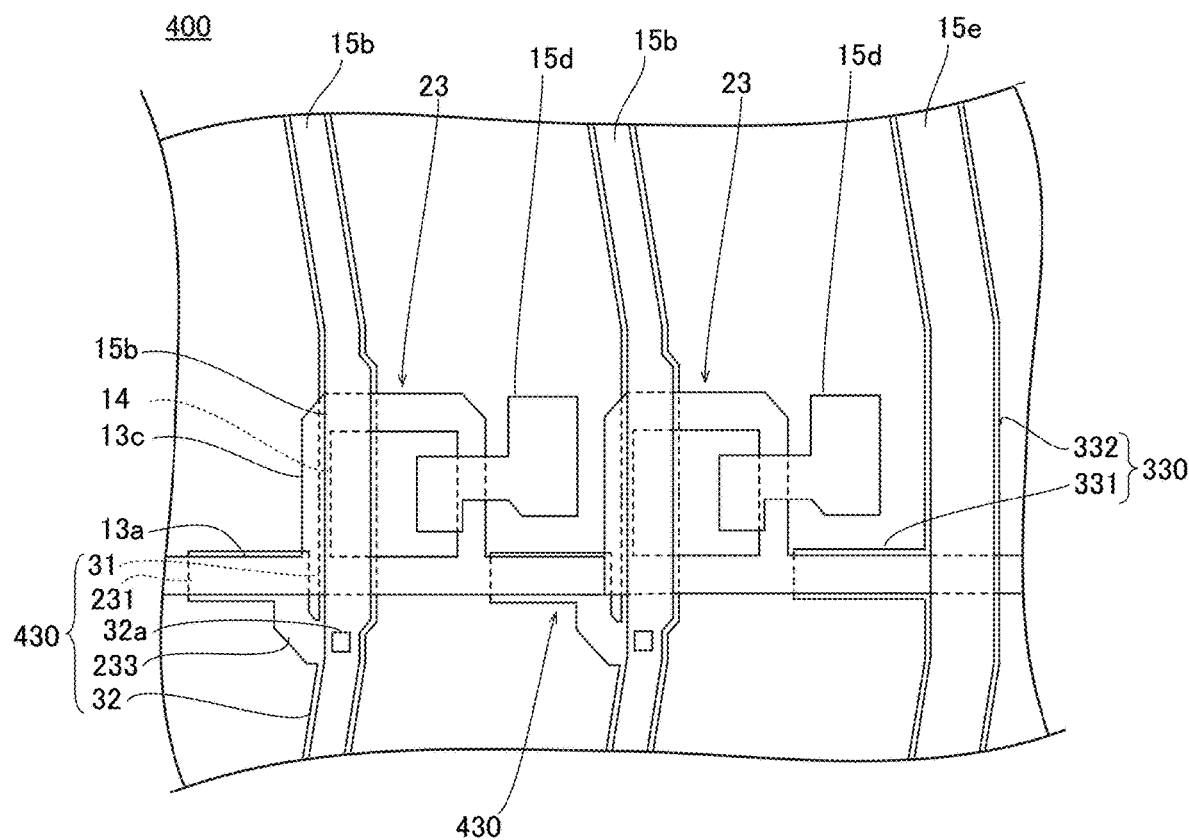
FIG. 11 illustrates a configuration of an electrode 430 of a display device 400 according to Modification Example 3 of Embodiment 1.

FIG. 11 illustrates a configuration of the electrode 430 of the display device 400 according to Modification Example 3 of Embodiment 1. The display device 400 includes the electrodes 330 and 430. Each electrode 430 includes the first portions 31 and 231, as well as the second portions 32 and 232. In addition, each electrode 430 includes a connection portion 233 that connects the first portion 231 and the second portion 232. Incidentally, the other configuration and effect of Modification Example 3 of Embodiment 1 are identical to the configuration and effect of Embodiment 1.

Embodiment 2

Next, a configuration of a display device 500 according to Embodiment 2 is described with reference to FIGS. 12 and 13. Embodiment 2 is described with reference to an example where an electrode 530a is formed in at least the pixel adjacent region R2, whereas Embodiment 1 is described with reference to an example in which the electrodes 30 are formed in the pixel region R1. Incidentally, the same constituent members as those in Embodiment 1 are denoted by the same reference symbols as those in Embodiment 1, and descriptions of the same are omitted.

Figure 12:
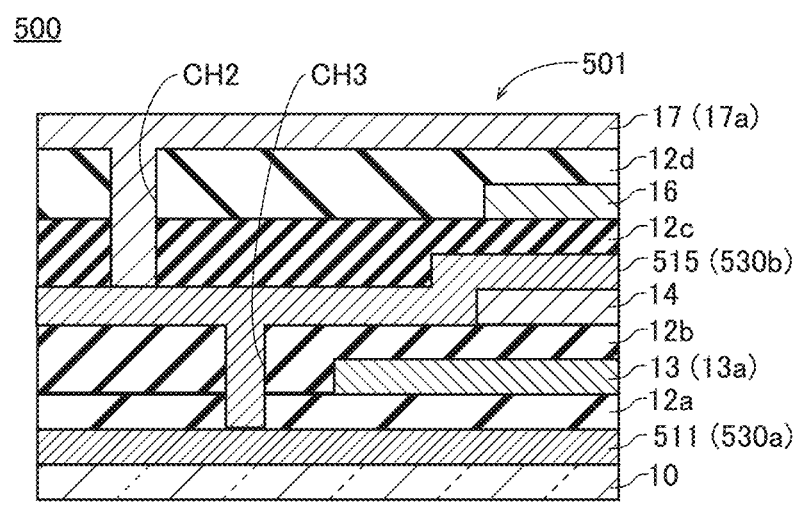
FIG. 12 is a schematic cross-sectional view illustrating a configuration of a display device 500 according to Embodiment 2.

FIG. 12 is a schematic cross-sectional view illustrating a configuration of a display device 500 according to Embodiment 2. FIG. 13 is a schematic plan view illustrating a configuration of an electrode 530a and a common electrode line 530b in a pixel adjacent region R2 according to Embodiment 2.

As shown in FIG. 12, the display device 500 includes the electrode 530a and a common electrode line 530b. The electrode 530a is an electrode layer portion formed in an electrode layer 511. The common electrode line 530b is formed in a source line layer 515, and is a source line layer portion formed to surround a pixel region R1 when viewed in a plan view. The common electrode line 530b is connected to the common electrodes 17a through the contact holes CH2 formed in the first insulating layer 12c and the second insulating layer 12d. The common electrode line 530b is a line intended to supply a signal to the common electrodes 17a. In addition, the electrode 530a is connected to the common electrode line 530b through the contact hole CH3 formed in a lower insulating layer 12a and a gate insulating layer 12b. The electrode 530a and the common electrode line 530b are formed in both of the pixel adjacent region R2 and the corner regions R3.

Figure 13:
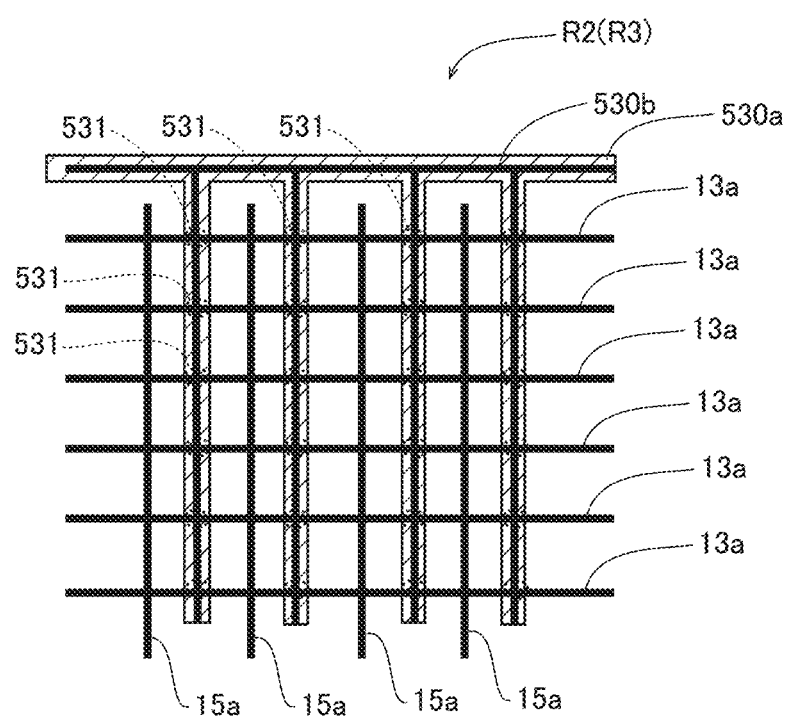
FIG. 13 is a schematic plan view illustrating a configuration of an electrode 530a and a common electrode line 530b in a pixel adjacent region R2 according to Embodiment 2.

As shown in FIG. 13, the electrode 530a is formed at positions that overlap with the common electrode line 530b when viewed in a plan view. For example, the electrode 530a and the common electrode line 530b are both formed in a comb-like shape at positions that do not overlap with the first source lines 15a when viewed in a plan view. At each portion 531 where the electrode 530a and the common electrode line 530b intersect with a first gate line 13a, the first gate line 13a is interposed between the electrode 530a and the common electrode line 530b. In the portion 531, the electrode 530a is opposed to the first gate line 13a with the lower insulating layer 12a being interposed therebetween, and the common electrode line 530b is opposed to the first gate line 13a with the gate insulating layer 12b being interposed therebetween. The portion 531 is a first gate line interposed portion that includes the electrode 530a (electrode layer portion) and the common electrode line 530b (source line layer portion). The electrode 530a and the common electrode line 530b overlap with at least one of the first gate lines 13a in the pixel adjacent region R2 (for example, the bypass region R2a) when viewed in a plan view, and in the normal line direction of the active matrix substrate 1, at least one of these first gate lines 13a is located between the electrode 530a and the common electrode line 530b. This makes the distance between the first gate lines 13a and the electrode 530a smaller, and makes the distance between the first gate lines 13a and the common electrode line 530b smaller, as compared with a case where the first gate lines 13a are not located between the electrode 530a and the common electrode line 530b. As a result, large capacitors can be formed between the electrode 530a and the common electrode line 530b on one hand, and the first gate line 13a on the other hand, even in the pixel adjacent region R2 where the distance between the first gate lines 13a is small. As a result, the difference between the capacitance of the first gate line 13a and the capacitance of the second gate line 13b can be reduced sufficiently, whereby the display quality of the display device 500 can be enhanced. Further, in Embodiment 2, the common electrode line 530b can be used as an electrode for increasing the capacitance of the first gate line 13a. Still further, the common electrode line 530b may be formed as a touch sensor line or a dummy touch sensor line in Embodiment 1 described above. Incidentally, the other configuration and effect of Embodiment 2 are identical to the configuration and effect of Embodiment 1.

Modification Example 1 of Embodiment 2

Next, a configuration of a display device 600 according to Modification Example 1 of Embodiment 2 is described with reference to FIG. 14. The configuration in Modification Example 1 of Embodiment 2 further includes electrodes 630 formed at positions that overlap with the first source lines 15a when viewed in a plan view, in addition to the configuration of Embodiment 2. Incidentally, the same constituent members as those in Embodiment 1 or 2 are denoted by the same reference symbols as those in Embodiment 1 or 2, and descriptions of the same are omitted.

Figure 14:
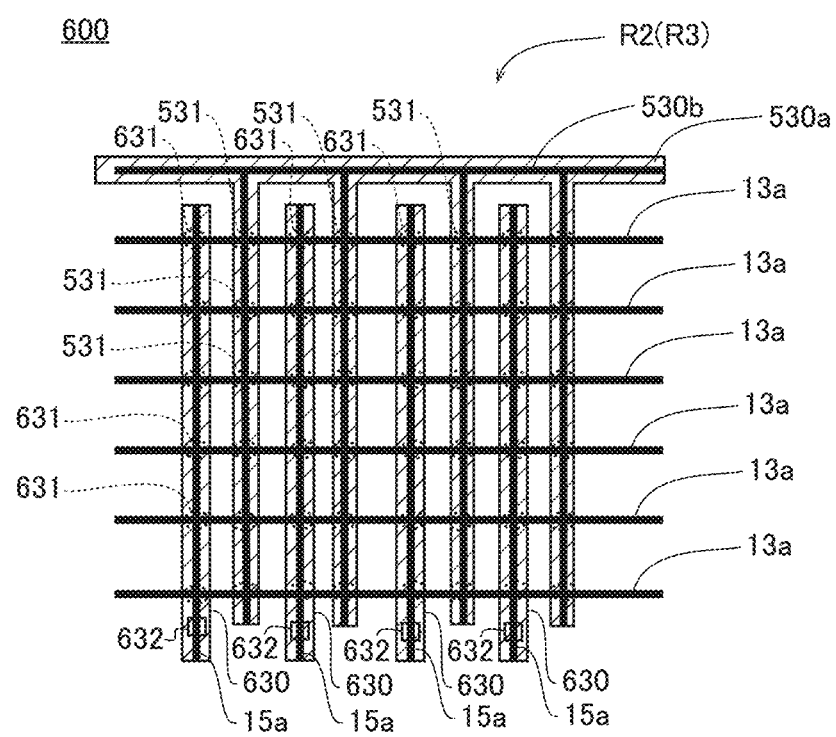
FIG. 14 is a schematic plan view illustrating a configuration of a display device 600 according to Modification Example 1 of Embodiment 2.

FIG. 14 is a schematic plan view illustrating a configuration of a display device 600 according to Modification Example 1 of Embodiment 2. The display device 600 includes electrodes 630, in addition to the electrode 530a (electrode layer portions) and the common electrode line 530b (source line layer portion). The electrodes 630 are formed in the same layer as the electrode 530a, and is formed at positions that overlap with the first source lines 15a when viewed in a plan view. In addition, at connection points 632 at positions that are inside the pixel adjacent region R2 and are in the vicinity of a boundary between the pixel adjacent region R2 and the outside thereof, the electrodes 630 are connected to the first source lines 15a via contact holes. The position that is inside the pixel adjacent region R2 and is in the vicinity of a boundary between the pixel adjacent region R2 and the outside thereof is, for example, a position located lower than the lowest first gate line 13a on the lower side on the sheet surface, among the first gate lines 13a.

At each portion 631 where the electrode 630 and the first source line 15a intersect with the first gate line 13a, the first gate line 13a is interposed between the electrode 630 and the first source line 15a. In the portion 631, the electrode 630 is opposed to the first gate line 13a with the lower insulating layer 12a being interposed therebetween, and the first source line 15a is opposed to the first gate line 13a with the gate insulating layer 12b being interposed therebetween. This causes the capacitance of the first gate line 13a to increase, whereby the difference between the capacitance of the first gate line 13a and the capacitance of the second gate line 13b decreases. The electrodes 630 are formed, not only in the pixel adjacent region R2, but also in corner regions R3. Incidentally, the other configuration and effect of Modification Example 1 of Embodiment 2 are identical to the configuration and effect of Embodiment 2.

Modification Example 2 of Embodiment 2

Next, a configuration of a display device 700 according to Modification Example 2 of Embodiment 2 is described with reference to FIG. 15. In Modification Example 2 of Embodiment 2, an electrode 730 also doubles as a common electrode line. Incidentally, the same constituent members as those in Embodiment 1 or 2 are denoted by the same reference symbols as those in Embodiment 1 or 2, and descriptions of the same are omitted.

Figure 15:
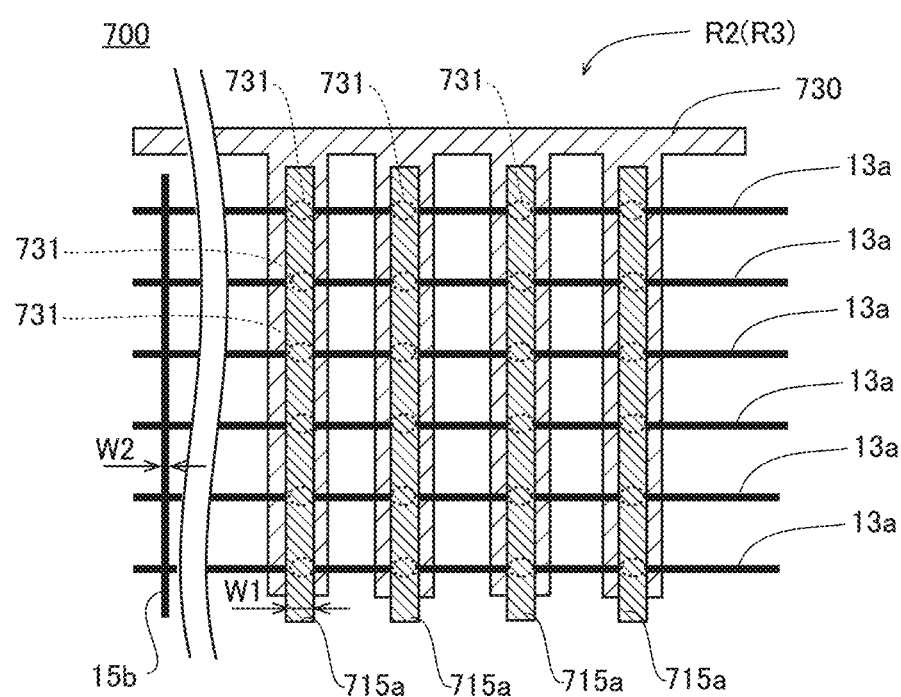
FIG. 15 is a schematic plan view illustrating a configuration of a display device 700 according to Modification Example 2 of Embodiment 2.

FIG. 15 is a schematic plan view illustrating a configuration of a display device 700 according to Modification Example 2 of Embodiment 2. The display device 700 includes the electrode 730 and first source lines 715a. The display device 700 is not provided with a common electrode line 530b, and the electrode 730 is connected to the common electrodes 17a. With this configuration, the electrode 730 functions as the common electrode line. In addition, a part of the electrode 730 is arranged at a position that overlaps with the first source lines 715a when viewed in a view, and is formed in a comb-like shape when viewed in a plan view. The first source line 715a has a width W1 greater than a width W2 of the second source line 15b. At each portion 731 where the electrode 730 and the first source line 715a intersect with the first gate line 13a, the first gate line 13a is located between the electrode 730 (electrode layer portion) and the first source line 715a (source line layer portion). This makes it possible to use the first source line 715a as an electrode (source line layer portion) for increasing the capacitance of the first gate line 13a, which makes it possible to prevent the configuration of the display device 700 from having complexity. The first source lines 715a and the electrode 730 are formed in both of the pixel adjacent region R2 and the corner regions R3. Incidentally, the other configuration and effect of Modification Example 2 of Embodiment 2 are identical to the configuration and effect of Embodiment 2.

Modification Example 3 of Embodiment 2

Next, a configuration of a display device 800 according to Modification Example 3 of Embodiment 2 is described with reference to FIG. 16. In the configuration in Modification Example 3 of Embodiment 2, an electrode 830 includes portions 832 formed along first gate lines 13a, and portions 831 formed along first source lines 715a, when viewed in a plan view. Incidentally, the same constituent members as those in Embodiment 1 or 2 are denoted by the same reference symbols as those in Embodiment 1 or 2, and descriptions of the same are omitted.

Figure 16:
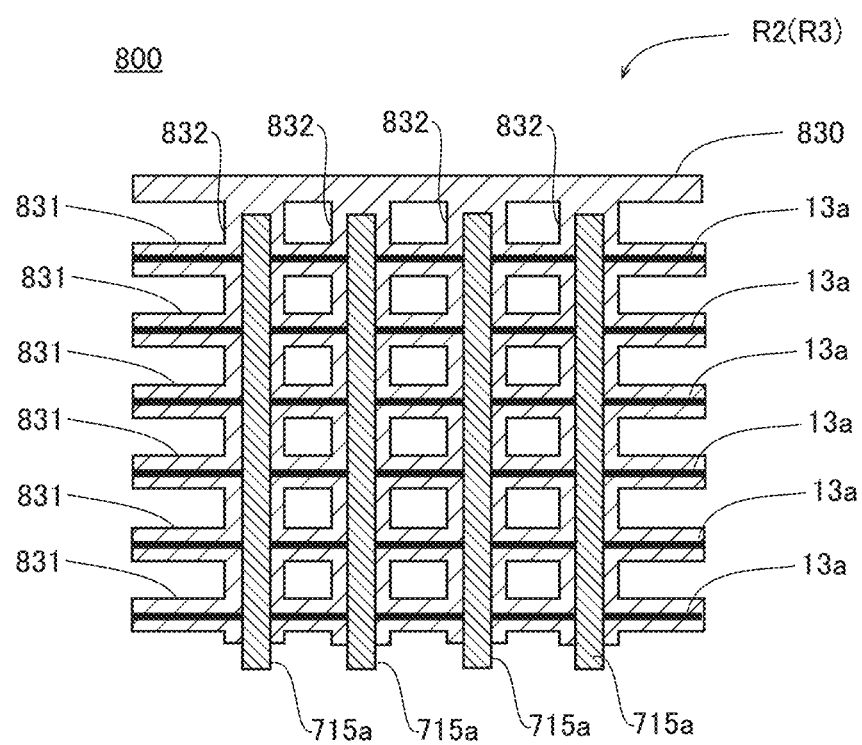
FIG. 16 is a schematic plan view illustrating a configuration of a display device 800 according to Modification Example 3 of Embodiment 2.

FIG. 16 is a schematic plan view illustrating a configuration of a display device 800 according to Modification Example 3 of Embodiment 2. The display device 800 includes the electrode 830 and the first source lines 715a in the pixel adjacent region R2 and the corner regions R3. The display device 800 is not provided with a common electrode line 530b, and the electrode 830 is connected to the common electrodes 17a. With this configuration, the electrode 830 functions as the common electrode line. In addition, the electrode 830 includes the portions 832 formed along the first gate lines 13a, and the portions 831 formed along the first source lines 715a, when viewed in a plan view. With this configuration, the first gate lines 13a are located between the electrode 830 (electrode layer portion) and the first source lines 715a (source line layer portions). As a result, the capacitance of the first gate line 13a increases, whereby the difference between the capacitance of the first gate line 13a and the capacitance of the second gate line 13b decreases. Incidentally, the other configuration and effect of Modification Example 3 of Embodiment 2 are identical to the configuration and effect of Embodiment 2.

Modification Example 4 of Embodiment 2

Next, a configuration of a display device 900 according to Modification Example 4 of Embodiment 2 is described with reference to FIG. 17. In Modification Example 4 of Embodiment 2, an electrode 930 is formed in a planar shape (solid state). Incidentally, the same constituent members as those in Embodiment 1 or 2 are denoted by the same reference symbols as those in Embodiment 1 or 2, and descriptions of the same are omitted.

Figure 17:
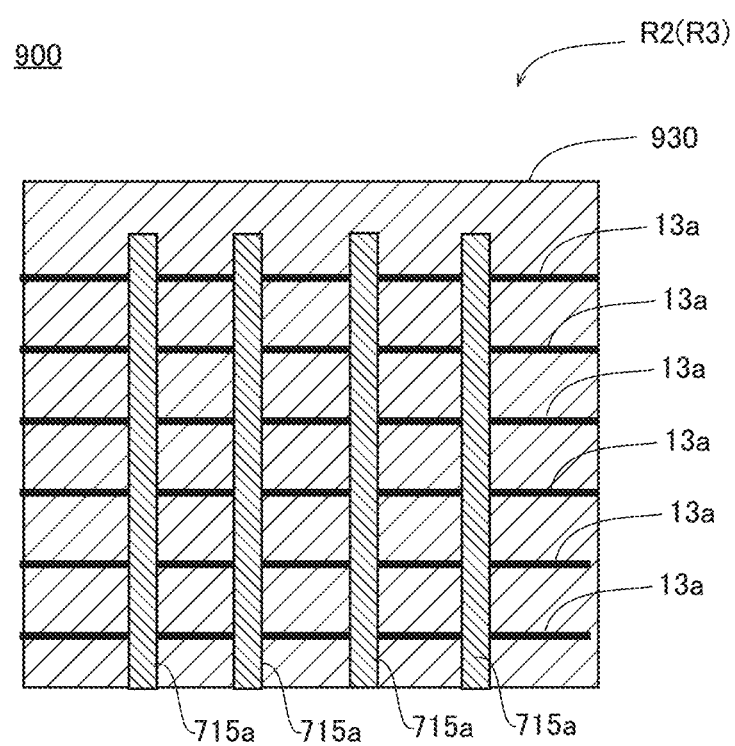
FIG. 17 is a schematic plan view illustrating a configuration of a display device 900 according to Modification Example 4 of Embodiment 2.

FIG. 17 is a schematic plan view illustrating a configuration of a display device 900 according to Modification Example 4 of Embodiment 2. The display device 900 includes the electrode 930 and the first source lines 715a in the pixel adjacent region R2 and the corner regions R3. The display device 900 is not provided with a common electrode line 530b, and the electrode 930 is connected to the common electrodes 17a. With this configuration, the electrode 930 functions as the common electrode line. In addition, the electrode 930 is formed at a position that overlaps with the first gate lines 13a and the first source lines 715a when viewed in a plan view, and is formed in a planar shape (solid form). With this configuration, the first gate lines 13a are located between the electrode 930 (electrode layer portion) and the first source lines 715a (source line layer portions). As a result, the capacitance of the first gate line 13a increases, whereby the difference between the capacitance of the first gate line 13a and the capacitance of the second gate line 13b decreases. Incidentally, the other configuration and effect of Modification Example 3 of Embodiment 2 are identical to the configuration and effect of Embodiment 2.

Embodiment 3

Next, a configuration of a display device 1000 according to Embodiment 3 is described with reference to FIGS. 18 to 19B. In Embodiment 3, widths of first gate lines 1013a to 1013j are set according to positions thereof from second gate lines 1013k, respectively. Incidentally, the same constituent members as those in Embodiment 1 or 2 are denoted by the same reference symbols as those in Embodiment 1 or 2, and descriptions of the same are omitted.

Figure 18:
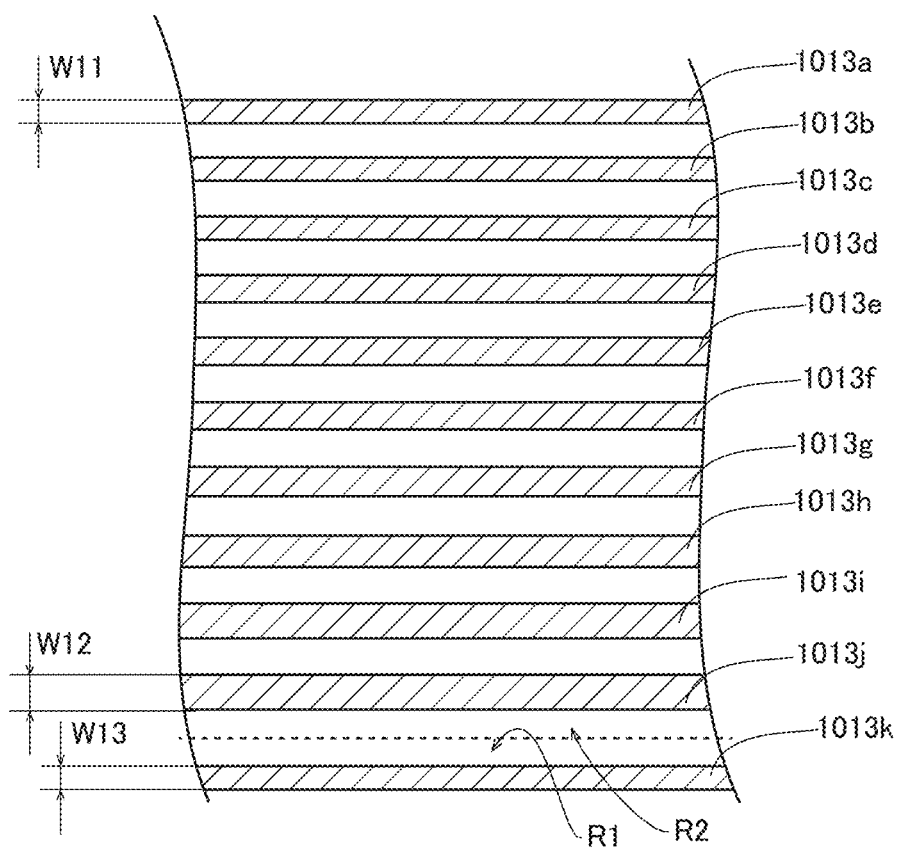
FIG. 18 is a schematic plan view illustrating a configuration of a display device 1000 according to Embodiment 3.

FIG. 18 is a schematic plan view illustrating a configuration of a display device 1000 according to Embodiment 3. As shown in FIG. 18, the display device 1000 includes the first gate lines 1013a to 1013j, and the second gate line 1013k. The first gate lines 1013a to 1013j are arranged in parallel to each other in the vertical direction of the sheet surface, in a pixel adjacent region R2. The first gate line 1013j, among the first gate lines 1013a to 1013j, is arranged at the position closest to the second gate line 1013k (the position closest to a pixel region R1 in the vertical direction of the sheet surface). The width W11 of the first gate line 1013a in the pixel adjacent region R2 is the smallest among the widths of the first gate lines 1013a to 1013j in the pixel adjacent region R2. Further, the width W12 of the first gate line 1013j in the pixel adjacent region R2 is the greatest among the widths of the first gate lines 1013a to 1013j in the pixel adjacent region R2. Still further, regarding the respective widths of the first gate lines 1013a to 1013j in the pixel adjacent region R2, the closer to the second gate line 1013k the first gate line is, the greater width the first gate line has, and the farther from the second gate line 1013k the first gate line is, the smaller width the first gate line has. Here, the width W12 of at least the first gate line 1013j located closest to the second gate line 1013k, among the first gate lines 1013a to 1013j, in the pixel adjacent region R2, is greater than the width W13 of the second gate line 1013k. In addition, in Embodiment 3, the width W11 of the first gate line 1013a in the pixel adjacent region R2 is greater than the width W13 of the second gate line 1013k.

Figure 19A:
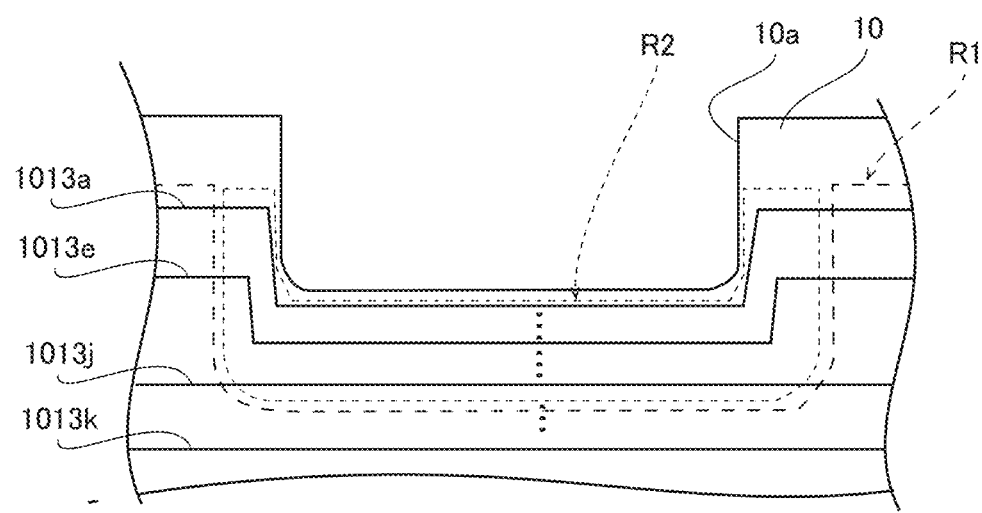
FIG. 19A is a diagram for explaining lengths of first gate lines 1013a to 1013j according to Embodiment 3.
Figure 19B:
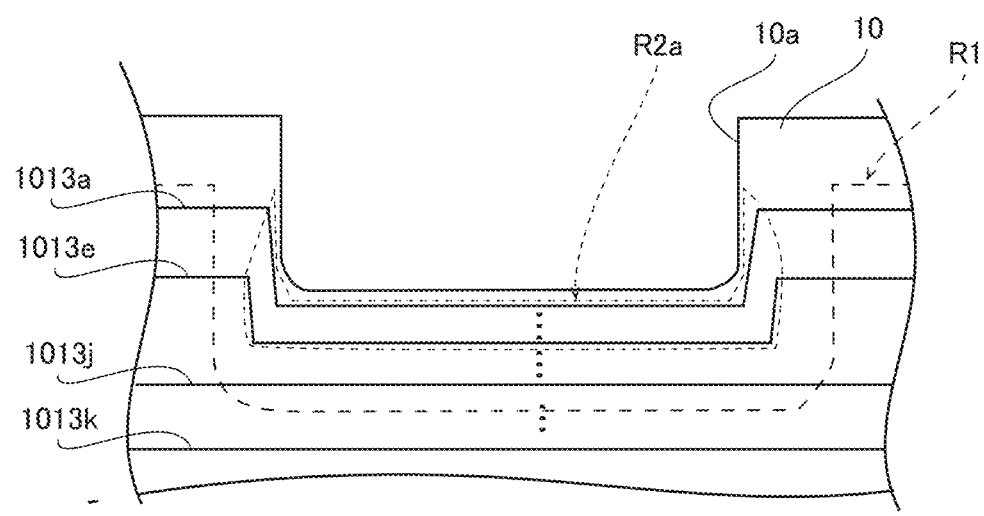
FIG. 19B is a schematic diagram for explaining a bypass region R2a according to Embodiment 3.

FIG. 19A is a diagram for explaining lengths of first gate lines 1013a to 1013j according to Embodiment 3. FIG. 19B is a schematic diagram for explaining a bypass region R2a according to Embodiment 3. As shown in FIGS. 19A and 19B, the first gate lines 1013a to 1013j are formed along a notch portion 10a, to bypass the notch portion 10a. The farther from the second gate line 1013k the first gate line is, the greater the length of the first gate line is. Here, the first gate line 1013j located closest to the second gate line 1013k, among the first gate lines 1013a to 1013j, is arranged to pass through curved parts of the corners of the pixel region R1, and the first gate line 1013a farthest from the second gate line 1013k is arranged not to pass through the curved parts. This makes the number of transistors 23 connected to the first gate line 1013j in the pixel region R1 smaller than the number of transistors connected to the second gate line 1013, and makes the foregoing number equal to or greater as compared with the first gate line 1013a. Based on what is described above, when the capacitance of the second gate line 1013k is given as Cg1, the capacitance of the first gate line 1013j is given as Cg2, and the capacitance of the first gate line 1013a is given as Cg3, the relationship is expressed by Formula (1) shown below:

$$Cg1 > Cg2 \geq Cg3 \tag{1}$$

In the display device 1000 in Embodiment 3 as well, as is the case with Embodiment 2, an electrode 530a is formed in the pixel adjacent region R2, whereby the capacitances of the first gate lines 1013a to 1013j are compensated. In addition, as the width W12 of the first gate line 1013j in the pixel adjacent region R2 is greater than the width W13 of the second gate line 1013k, and the width W11 of the first gate line 1013a in the pixel adjacent region R2 is greater than the width W13 of the second gate line 1013k, the capacitances of the first gate lines 1013a to 1013j are compensated. Here, when the compensation capacitance of the first gate line 1013j is given as Cd2, and the compensation capacitance of the first gate line 1013a is given as Cd3, the relationship is expressed by Formula (2) shown below:

$$Cg1 \geq Cg2 + Cd2 \geq Cg3 + Cd3 \tag{2}$$

With Embodiment 3, the capacitance of the first gate line 1013j can be made closer to the capacitance of the second gate line 1013k, as expressed by Formula (2) above. In addition, as the width W12 of the first gate line 1013j in the pixel adjacent region R2 is greater than the width W11 of the first gate line 1013a in the pixel adjacent region R2, the relationship expressed by Formula (3) below is established:

$$Cd2 > Cd3 \tag{3}$$

According to Formula (3) above, also in the pixel adjacent region R2, which is narrow, the differences between the capacitances of the first gate lines 1013*a* to 1013*j* and the capacitance of the second gate line 1013*k* can be reduced preferentially from the first gate line closer to the second gate line 1013*k*. As a result, the deterioration of display quality (brick-pattern display) is hardly visualized. In the display device 1000 in Embodiment 3 as well, electrodes 30, not shown, may be provided to compensate the capacitances of the first gate lines 1013*a* to 1013*j*. Incidentally, the other configuration and effect of Embodiment 3 are identical to the configuration and effect of Embodiment 1 or 2.

Modification Example of Embodiment 3

Next, a configuration of a display device 1100 according to a modification example of Embodiment 3 is described with reference to FIGS. 20A to 20B. In the modification example of Embodiment 3, a pixel adjacent region R12 is formed inside a pixel region R11. Incidentally, the same constituent members as those in Embodiment 1 or 2 are denoted by the same reference symbols as those in Embodiment 1 or 2, and descriptions of the same are omitted.

Figure 20A:
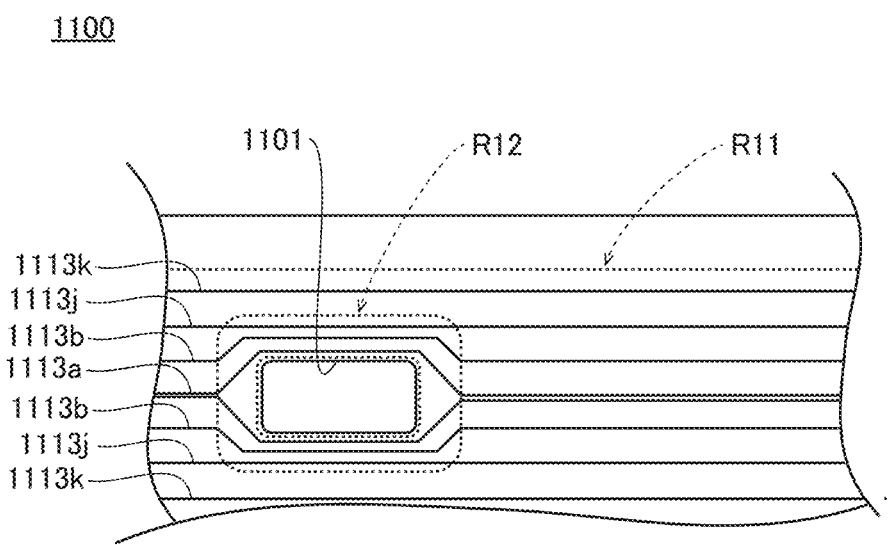
FIG. 20A is a schematic plan view illustrating a configuration of a display device 1100 according to a modification example of Embodiment 3.
Figure 20B:
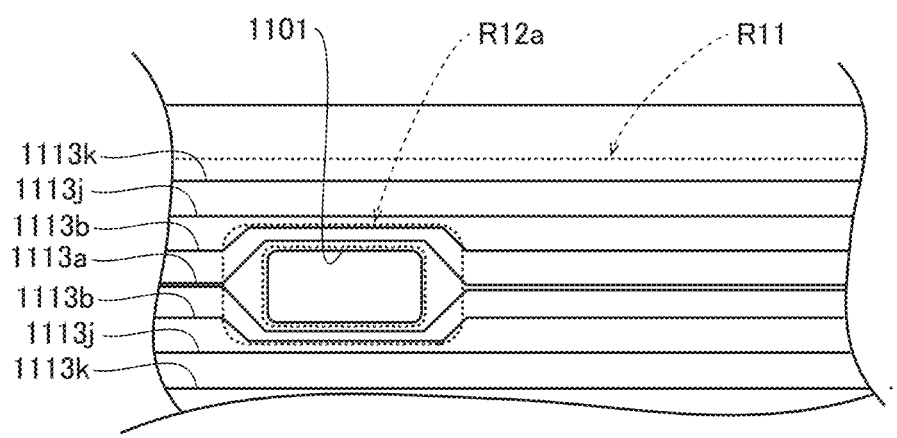
FIG. 20B is a schematic diagram for explaining a bypass region R12a according to a modification example of Embodiment 3.

FIG. 20A is a schematic plan view illustrating a configuration of a display device 1100 according to a modification example of Embodiment 3. In the display device 1100, a camera hole 1101 (aperture) is formed inside the pixel region R11. Incidentally, in the camera hole 1101, a camera, not shown, is arranged. In addition, the display device 1100 includes first gate lines 1113*a*, 1113*b*, and 1113*j*, as well as a second gate line 1113*k*.

The first gate line 1113*j*, among the first gate lines 1113*a*, 1113*b*, and 1113*j*, is arranged at the position closest to the second gate line 1113*k*. Further, the width of the first gate line 1113*a* in the bypass region R12*a* of the pixel adjacent region R12 is the smallest among the widths of the first gate lines 1113*a*, 1113*b*, and 1113*j* in the pixel adjacent region R12, and the width of the first gate line 1113*j* in the pixel adjacent region R12 is the greatest among the widths of the first gate lines 1113*a*, 1113*b*, and 1113*j* in the pixel adjacent region R12. Regarding the first gate lines 1113*a*, 1113*b*, and 1113*j*, the closer to the second gate line 1113*k* the first gate line is arranged, the greater width it has. Here, the width of at least the first gate line 1113*j* located closest to the second gate line 1113*k*, among the first gate lines 1113*a*, 1113*b*, and 1113*j*, in the pixel adjacent region R12, is greater than the width of the second gate line 1113*k*. With this configuration, also in the pixel adjacent region R12 in the modification example of Embodiment 3, the differences between the capacitances of the first gate lines 1113*a*, 1113*b*, and 1113*j*, and the capacitance of the second gate line 1113*k* can be reduced preferentially from the first gate line closer to the second gate line 1113*k*. Incidentally, the other configuration and effect of the modification example of Embodiment 3 are identical to the configuration and effect of Embodiment 3.

Embodiment 4

Next, a configuration of a display device 1300 according to Embodiment 4 is described with reference to FIGS. 21 to 26. In Embodiment 4, a notch portion 1310*a* having an arc shape is formed in an active matrix substrate 1301. Incidentally, the same constituent members as those in any one of Embodiment 1 to 3 are denoted by the same reference symbols as those in Embodiment 1 to 3, and descriptions of the same are omitted.

Figure 21:
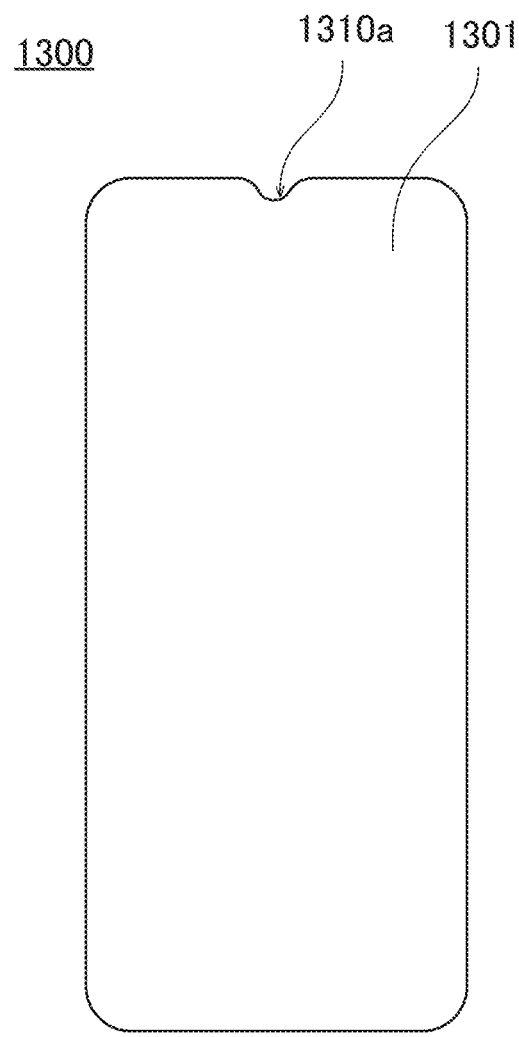
FIG. 21 illustrates a configuration of a display device 1300 according to Embodiment 4.
Figure 22:
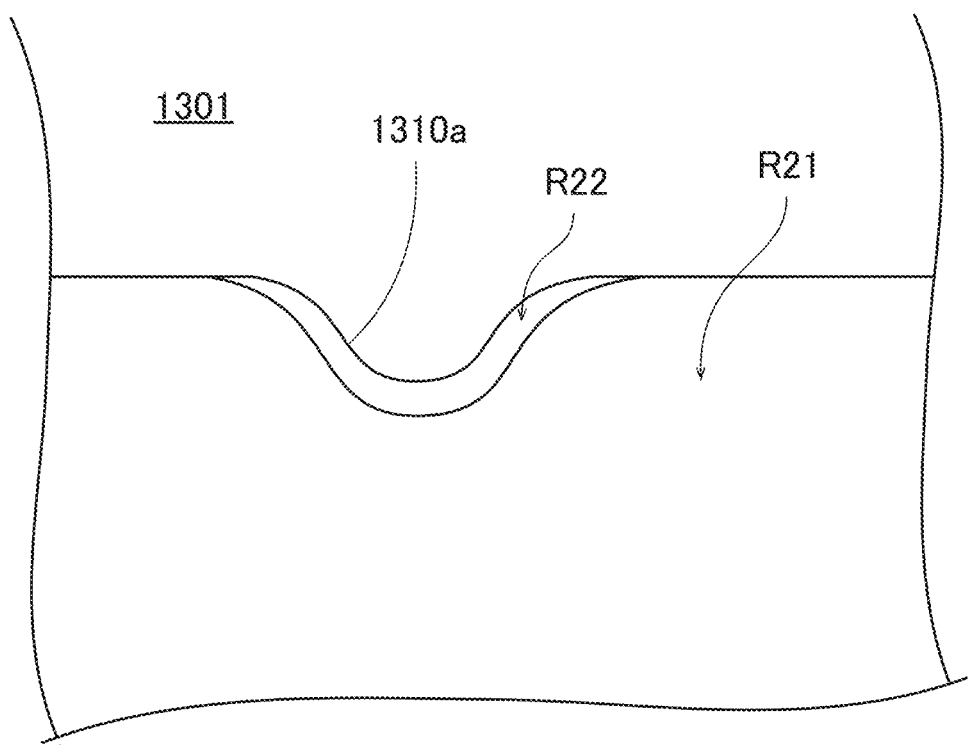
FIG. 22 illustrates a configuration of a notch portion 1310a according to Embodiment 4.
Figure 23:
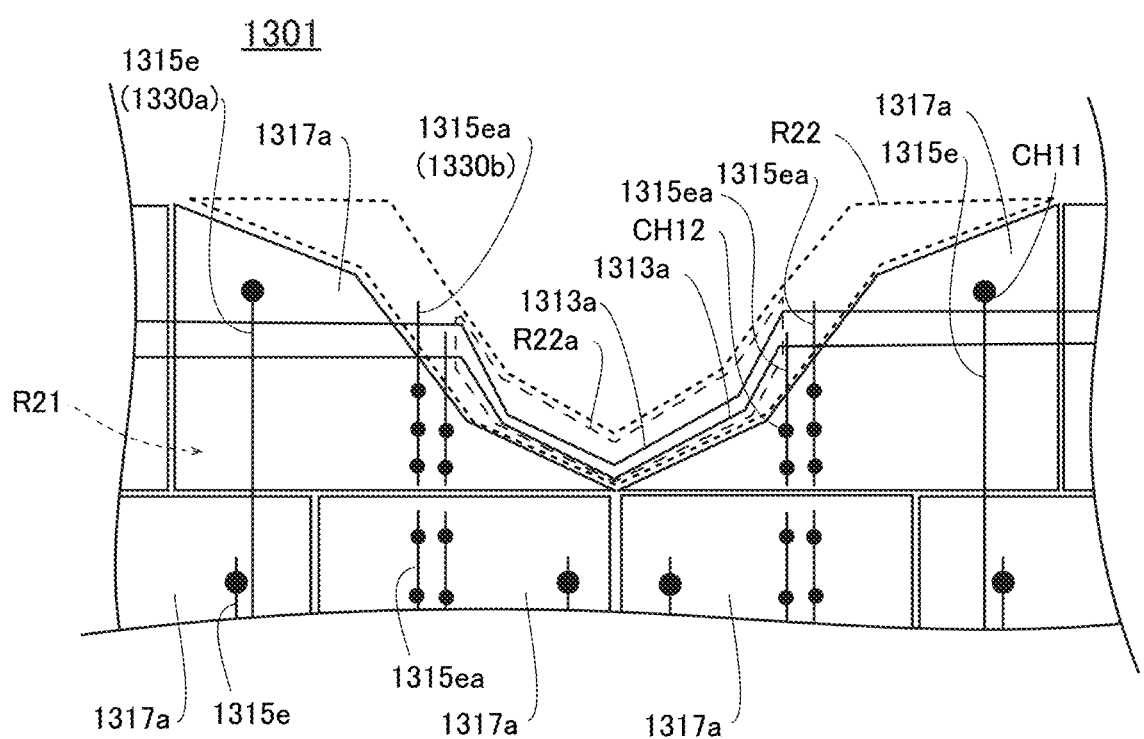
FIG. 23 illustrates a configuration of touch sensor electrodes 1317a arranged in the vicinity of the notch portion 1310a according to Embodiment 4.

FIG. 21 illustrates a configuration of a display device 1300 according to Embodiment 4. FIG. 22 illustrates a configuration of a notch portion 1310*a* according to Embodiment 4. FIG. 23 illustrates a configuration of touch sensor electrodes 1317*a* arranged in the vicinity of the notch portion 1310*a* according to Embodiment 4. As shown in FIG. 21, in Embodiment 4, the notch portion 1310*a* is formed that is recessed in an arc form from an upper edge of the active matrix substrate 1301 toward the inside. Along the notch portion 1310*a*, a pixel adjacent region R22 is provided in which a black matrix 1320*a* (see FIG. 24) is arranged. In addition, on the active matrix substrate 1301, a pixel region R21 is provided on a side opposite to the notch portion 1310*a* with respect to the pixel adjacent region R22.

As shown in FIG. 23, on the active matrix substrate 1301, a plurality of common electrodes 1317*a* (touch sensor electrodes), a plurality of touch sensor lines 1315*e*, and a plurality of dummy touch sensor lines 1315*ea* are provided. The touch sensor lines 1315*e* and the dummy touch sensor lines 1315*ea* are arranged and extended in parallel with each other. The touch sensor lines 1315*e* are connected to the common electrodes 1317*a* through contact holes CH11. The dummy touch sensor lines 1315*ea* are connected to the common electrodes 1317*a* through a plurality of contact holes CH12.

In addition, in Embodiment 4, electrodes 1330*a* extending along the touch sensor lines 1315*e* are arranged on the active matrix substrate 1301, at positions that overlap with the touch sensor line 1315*e* when viewed in a plan view. In addition, electrodes 1330*b* extending along the dummy touch sensor lines 1315*ea* are arranged on the active matrix substrate 1301, at positions that overlap with the dummy touch sensor line 1315*ea* when viewed in a plan view. The electrodes 1330*a* are provided in correspondence to the touch sensor lines 1315*e*, respectively, on the active matrix substrate 1301. The electrodes 1330*b* are provided in correspondence to the dummy touch sensor lines 1315*ea*, respectively, on the active matrix substrate 1301. The electrode 1330*a* has the same shape as that of the touch sensor line 1315*e* when viewed in a plan view. The electrode 1330*b* has the same shape as that of the dummy touch sensor line 1315*ea* when viewed in a plan view. In other words, in Embodiment 4, with the electrodes 1330*a* and 1330*b* thus provided, each of all the touch sensor lines 1315*e* and the dummy touch sensor lines 1315*ea* is in a two-layer structure.

Further, the touch sensor lines 1315*e*, the dummy touch sensor lines 1315*ea*, and the electrodes 1330*a* and 1330*b* extend from the pixel region R21 to the pixel adjacent region R22. Still further, the touch sensor lines 1315*e* and the electrodes 1330*a* intersect with the first gate lines 1313*a* when viewed in a plan view, within the pixel adjacent region R22. The dummy touch sensor lines 1315*ea* and the electrodes 1330*b* intersect with the first gate lines 1313*a* when viewed in a plan view, within the pixel adjacent region R22. Incidentally, the dummy touch sensor lines 1315*ea* are only partially shown in FIG. 23. In addition, in FIG. 23, the illustration of the touch sensor lines 1315*e* in the pixel adjacent region R22 is omitted.

Figure 24:
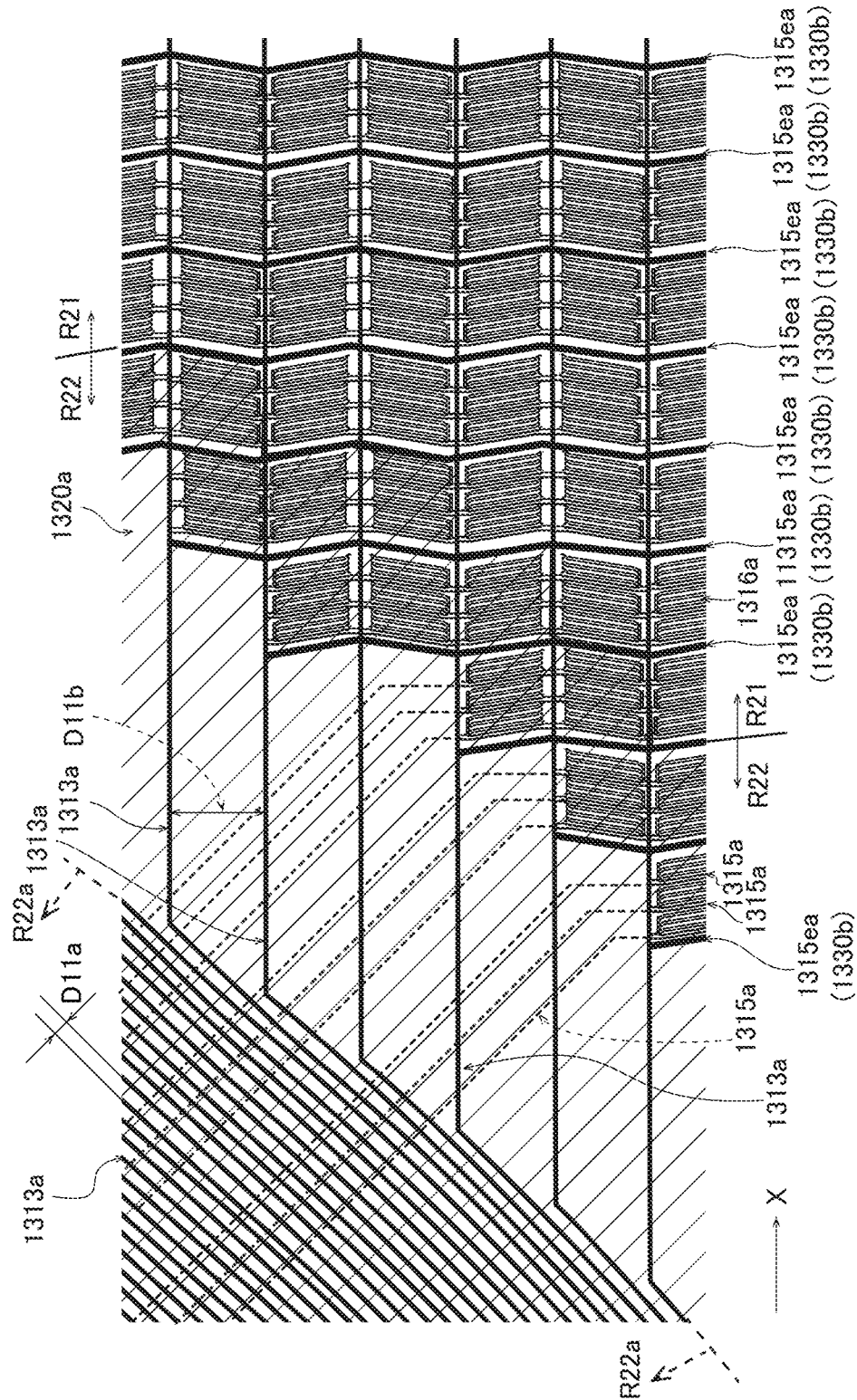
FIG. 24 is a diagram for explaining a boundary part between a pixel region R21 and a pixel adjacent region R22 in Embodiment 4.

FIG. 24 is a diagram for explaining a boundary part between a pixel region R21 and a pixel adjacent region R22 in Embodiment 4. The pixel adjacent region R22 is a region in which a black matrix 1320*a* (hatched portion in FIG. 24) is arranged. For example, as shown in FIG. 24, some of a plurality of pixel electrode 1316*a* are covered with the black matrix 1320*a*. Here, the direction in which the first gate lines 1313*a* extend in the pixel region R21 is given as an X direction, and then, a distance between the first gate lines 1313*a* in the pixel region R21 (a distance therebetween in the direction orthogonal to the X direction) is D11*b*. Further, in a region in the pixel adjacent region R22 where the first gate lines 1313a extend in the X direction, a distance between the first gate lines 1313a is D11b. Then, in a bypass region R22a in the pixel adjacent region R22 where the first gate lines 1313a extend in a direction intersecting with the X direction (a region in which the first gate lines 1313a bypass the notch portion 1310a), a distance between the first gate lines 1313a is D11a smaller than D11b.

Further, as shown in FIG. 24, the first source lines 1315a extend from the pixel region R21 to the bypass region R22a of the pixel adjacent region R22. The first source lines 1315a are arranged to intersect with the first gate lines 1313a within the bypass region R22a of the pixel adjacent region R22. For example, the first source lines 1315a are arranged to cross at right angles with the first gate lines 1313a, which extend intersecting with the X direction within the bypass region R22a.

Figure 25:
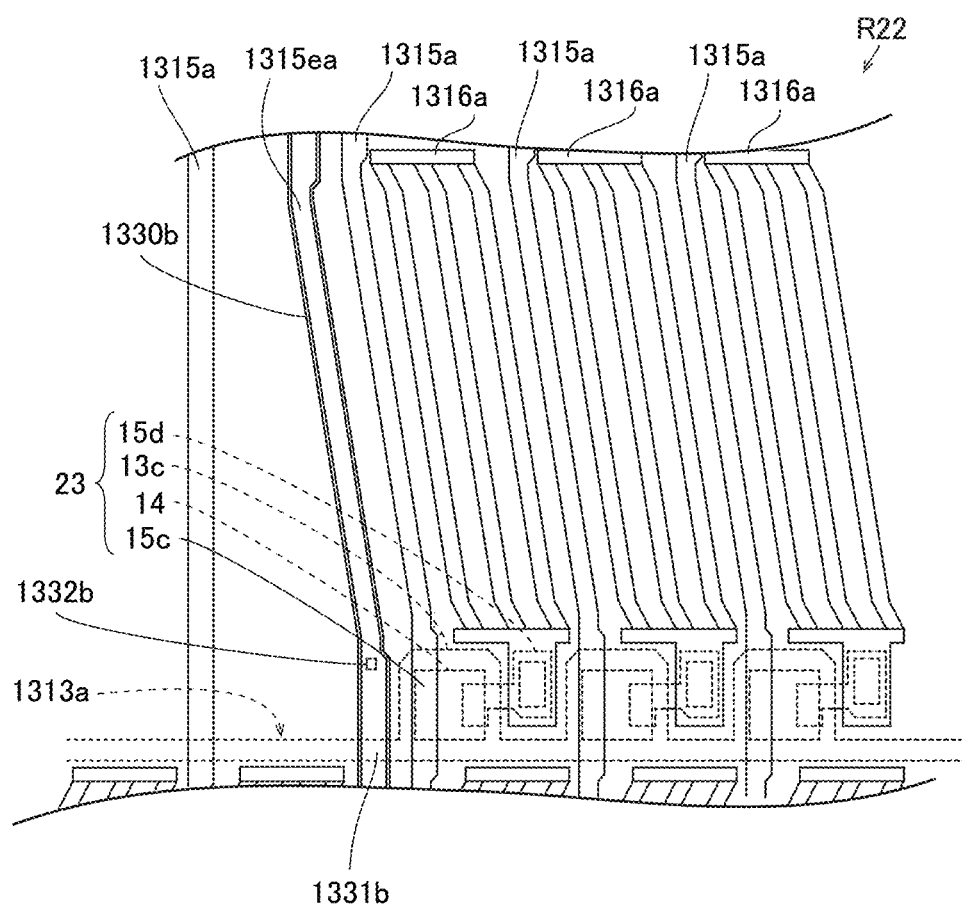
FIG. 25 is a diagram for explaining a configuration of dummy touch sensor lines 1315ea and electrodes 1330b in the pixel adjacent region R22 according to Embodiment 4.

FIG. 25 is a diagram for explaining a configuration of dummy touch sensor lines 1315ea and electrodes 1330b in the pixel adjacent region R22 according to Embodiment 4. Each electrode 1330b includes a portion 1331b intersecting with the first gate line 1313a. The first gate line 1313a is interposed between the portion 1331b and the dummy touch sensor line 1315ea. The dummy touch sensor line 1315ea and the electrode 1330b are connected via a connection portion 1332b (for example, a contact hole).

Figure 26:
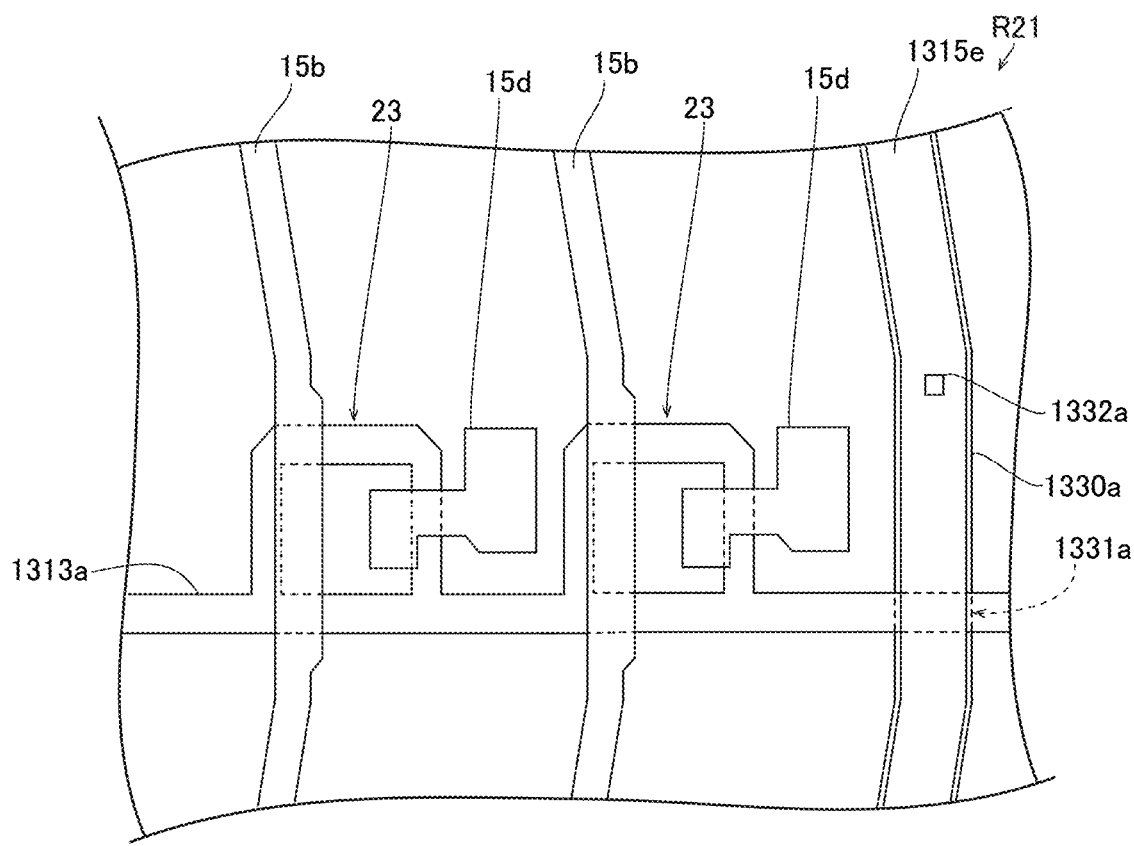
FIG. 26 is a diagram for explaining a configuration of touch sensor lines 1315e and electrodes 1330a in the pixel region R21 according to Embodiment 4.

FIG. 26 is a diagram for explaining a configuration of touch sensor lines 1315e and electrodes 1330a in the pixel region R21 according to Embodiment 4. Each electrode 1330a includes a portion 1331a intersecting with the first gate line 1313a. The first gate line 1313a is interposed between the portion 1331a and the touch sensor line 1315e. The touch sensor line 1315e and the electrode 1330a are connected via a connection portion 1332a (for example, a contact hole).

With Embodiment 4 as well, large capacitors can be formed between the electrodes 1330a and 1330b as well as the first gate lines 1313a. As a result, the difference between the capacitances of the first gate lines 1313a and the capacitances of the second gate lines can be reduced sufficiently, which makes it possible to prevent the display quality from deteriorating due to the difference between the capacitances of the first gate lines 1313a and the capacitances of the second gate lines. Incidentally, the other configuration and effect of Embodiment 4 are identical to the configuration and effect of any one of Embodiments 1 to 3.

Embodiment 5

Next, a configuration of an active matrix substrate 1401 according to Embodiment 5 is described with reference to FIGS. 27 and 28. In Embodiment 5, portions 1431a of electrodes 1430a intersecting with the first gate lines 1413a have a width W32 greater than a width W31 of other portions of the electrodes 1430a. Incidentally, the same constituent members as those in any one of Embodiment 1 to 4 are denoted by the same reference symbols as those in Embodiment 1 to 4, and descriptions of the same are omitted.

Figure 27:
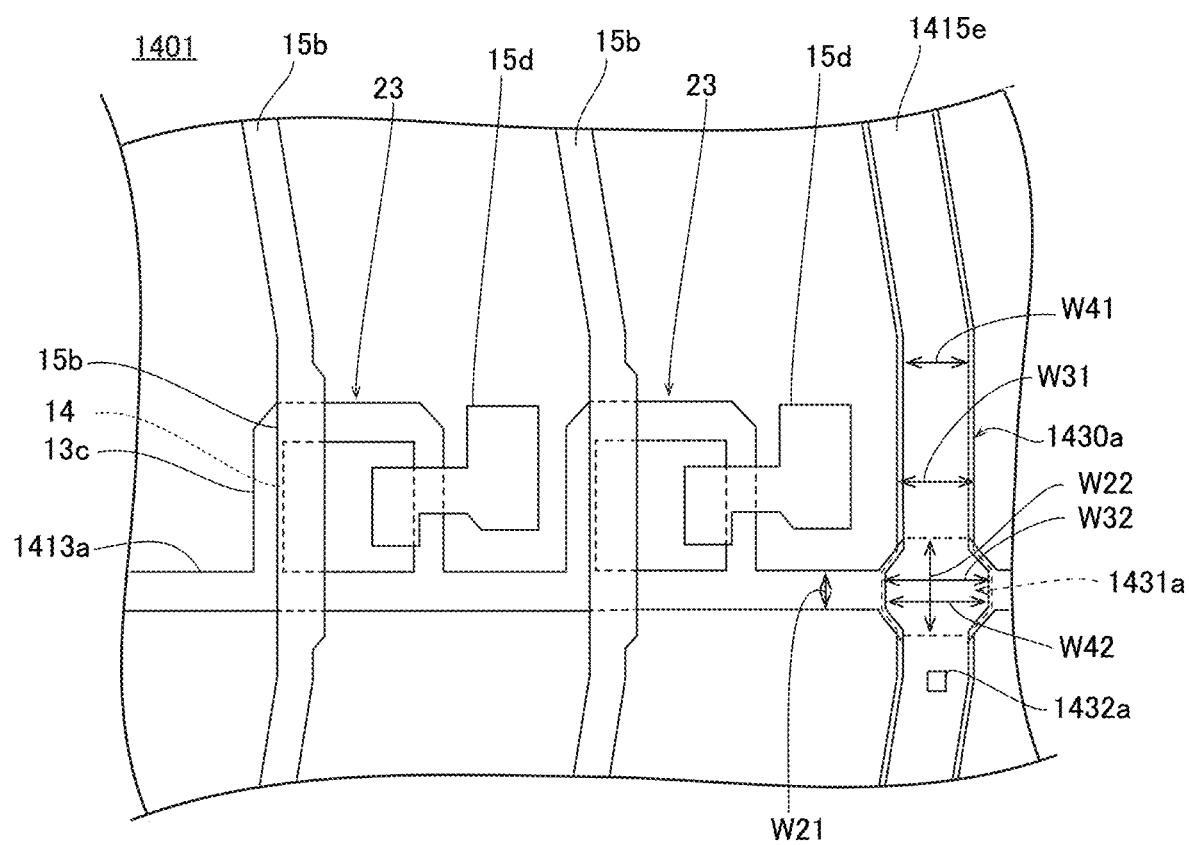
FIG. 27 is a diagram for explaining a configuration of an active matrix substrate 1401 according to Embodiment 5.

FIG. 27 is a diagram for explaining a configuration of an active matrix substrate 1401 according to Embodiment 5. The active matrix substrate 1401 includes first gate lines 1413a, touch sensor lines 1415e, and electrodes 1430a. The electrodes 1430a are arranged to overlap with the touch sensor lines 1415e when viewed in a plan view, and extend along the touch sensor lines 1415e. In addition, each electrode 1430a has approximately the same shape as that of the touch sensor line 1415e. "Approximately the same shape" also encompasses a shape that, when laid over another one, substantially overlaps with each other when viewed in a plan view, though having a difference in the width. The touch sensor line 1415e and the electrode 1430a are connected via a connection portion 1432a (for example, a contact hole).

As shown in FIG. 27, in Embodiment 5, portions 1431a of electrodes 1430a intersecting with the first gate lines 1413a have a width W32 greater than a width W31 of other portions of the electrodes 1430a. In addition, portions of the first gate lines 1413a intersecting with the electrodes 1430a have a width W22 greater than a width W21 of other portions of the first gate lines 1413a. In addition, portions of the touch sensor lines 1415e intersecting with the first gate lines 1413a have a width W42 greater than a width W41 of other portions of the touch sensor lines 1415e.

Figure 28:
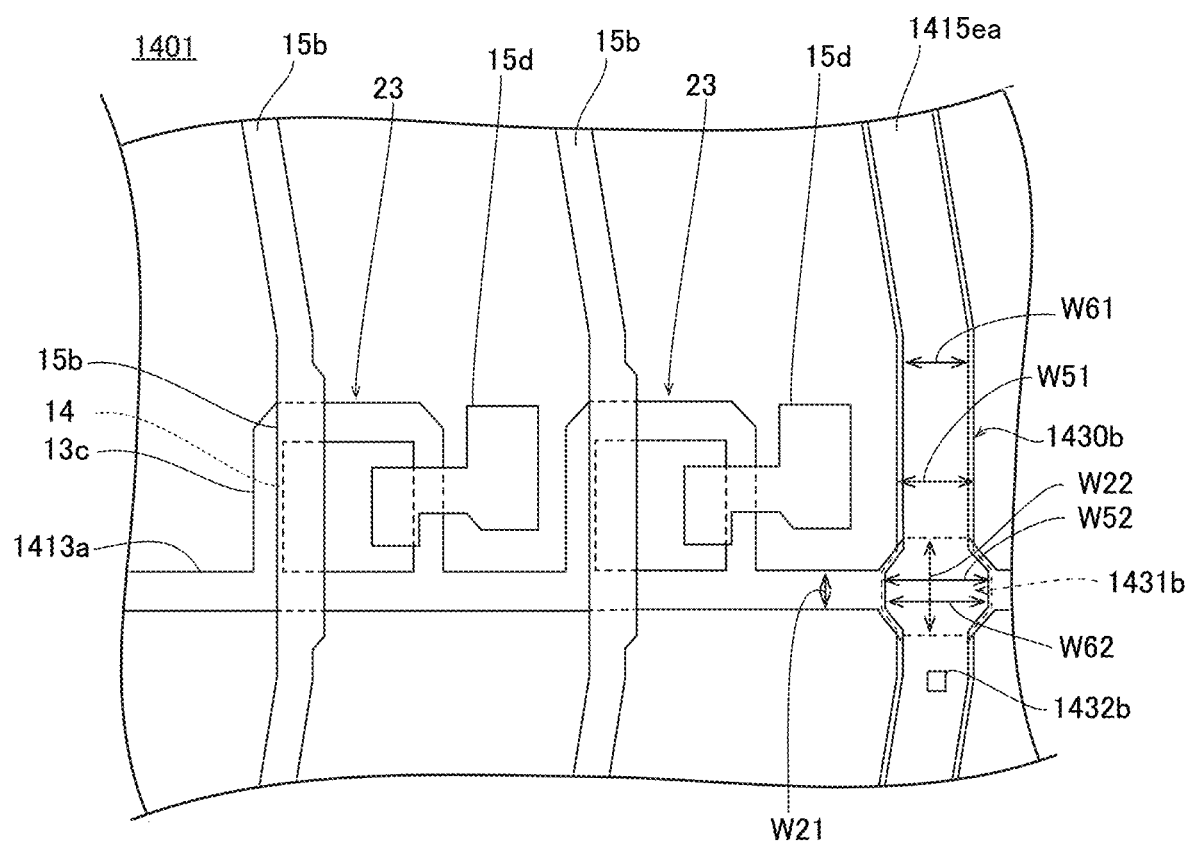
FIG. 28 is a diagram for explaining a configuration of dummy touch sensor lines 1415ea and electrodes 1430b according to Embodiment 5.

FIG. 28 is a diagram for explaining a configuration of an active matrix substrate 1401 according to Embodiment 5. The active matrix substrate 1401 includes dummy touch sensor lines 1415ea, and electrodes 1430b. The electrodes 1430b are arranged to overlap with the dummy touch sensor lines 1415ea when viewed in a plan view, and extend along the dummy touch sensor lines 1415ea. In addition, each electrode 1430b has approximately the same shape as that of the dummy touch sensor line 1415ea. The dummy touch sensor line 1415ea and the electrode 1430b are connected via a connection portion 1432b (for example, a contact hole). As shown in FIG. 28, portions 1431b of electrodes 1430b intersecting with the first gate lines 1413a have a width W52 greater than a width W51 of other portions of the electrodes 1430b. In addition, portions of the dummy touch sensor lines 1415ea intersecting with the first gate lines 1413a have a width W62 greater than a width W61 of other portions of the dummy touch sensor lines 1415ea. Incidentally, in Embodiment 5, the electrodes 1430a and the electrodes 1430b are arranged in both of the pixel region and the pixel adjacent region. The configuration, however, is not limited to this example, and the electrodes 1430a and the electrodes 1430b may be arranged in only either the pixel region or the pixel adjacent region.

With Embodiment 5, larger capacitors can be formed at portions where the electrodes 1430a and 1430b and the first gate lines 1413a intersect. Incidentally, the other configuration and effect of Embodiment 5 are identical to the configuration and effect of any one of Embodiments 1 to 4.

The embodiments are thus described above, but the above-described embodiments are merely examples for implementing the present disclosure. The present disclosure, therefore, is not limited to the above-described embodiments, and the above-described embodiments can be appropriately varied and implemented without departing from the spirit and scope of the invention.

(1) Examples are so far described in which Embodiments 1 to 5 are implemented as liquid crystal display devices, but the present disclosure is not limited to these. For example, Embodiments 1 to 5 may be implemented as organic EL display devices.

(2) Examples are so far described in which Embodiments 1 to 5 are implemented as liquid crystal display devices, but the present disclosure is not limited to these. For example, Embodiments 1 to 5 may be implemented as electronic paper (microcapsule-type electrophoretic display panels).

(3) Examples in which a plurality of common electrodes are provided are described above as Embodiments 1 to 5, but the present disclosure is not limited to these. For example, only one common electrode may be provided on the active matrix substrate.

(4) Examples in which a display device (active matrix substrate) is configured as a touch panel are described as Embodiments 1 to 5, but the present disclosure is not limited to these. In other words, a display device (active matrix substrate) without a touch detection function may be configured.

(5) Embodiments 1 to 5 are described as separate embodiments, but in the present disclosure, a display device may be configured by appropriately combining any of Embodiments 1 to 3. For example, a configuration may be such that the electrodes 30 of Embodiment 1 are provided in the pixel adjacent region R2, and the electrode 530a and the common electrode lines 530b of Embodiment 2 are formed in the pixel region R1.

(6) Examples in which, as shown in FIG. 3A, two gate driving circuits are provided in a display device and gate lines are connected alternately to the gate driving circuit on the left side on the surface of the sheet carrying FIG. 3A (hereinafter referred to as the sheet surface) and the gate driving circuit on the right side on the sheet surface are described above as Embodiments 1 to 5, but the present disclosure is not limited to these. All of the gate lines may be connected to only one gate driving circuit, or alternatively, each gate line is connected to both of the two gate driving circuits (a bidirectional input system may be used).

(7) Examples in which the electrode layer is formed with a metal material such as copper or aluminum are described above as Embodiments 1 to 5, but the present disclosure is not limited to these. For example, the electrode layer may be formed with a transparent conductive film such as an indium tin oxide (ITO) film.

(8) Examples in which the electrode layer is formed below the gate line layer are described above as Embodiments 1 to 5, but the present disclosure is not limited to these. For example, the electrode layer may be formed above the gate line layer.

(9) Examples in which the common electrode layer is formed above the pixel electrode layer are described above as Embodiments 1 to 5, but the present disclosure is not limited to these. For example, the common electrode layer may be formed below the pixel electrode layer.

(10) An example in which the common electrodes are arranged in both of the pixel adjacent region R2 and the corner regions R3 is described above as Embodiment 2, but the present disclosure is not limited to these. For example, the electrodes may be arranged only in the pixel adjacent region R2.

(11) Examples in which electrodes are provided with respect to all of the first gate lines are described above as Embodiments 1 to 5, but the present disclosure is not limited to these. In other words, electrodes may be provided with respect to only a part of the first gate lines.

(12) Examples in which a part of the pixel adjacent region is provided as a bypass region are described above as Embodiments 1 to 5, but the whole pixel adjacent region may be provided as a bypass region.

The above-described display device can be described as follows.

A display device according to a first configuration includes: a substrate in which a notch or an aperture is formed; a plurality of gate lines formed in a gate line layer on the substrate; a plurality of source lines formed in a source line layer that is a layer different from the gate line layer, the source lines being arranged to intersect with the gate lines when viewed in a plan view; and electrodes at least a part of which are formed in an electrode layer that is a layer different from any of the gate line layer and the source line layer, wherein the substrate includes a pixel region in which pixels defined by the gate lines and the source lines are formed; the substrate further includes a pixel adjacent region between the notch or the aperture and the pixel region, the pixel adjacent region being adjacent to the pixel region; the gate lines include a plurality of first gate lines that pass through the pixel adjacent region, and second gate lines that do not pass through the pixel adjacent region; a distance between the first gate lines in the pixel adjacent region is smaller than a distance between the first gate lines in the pixel region; each electrode include at least either of a capacitor forming portion that is arranged within the pixel region and overlaps with at least one of the first gate line when viewed in a plan view, and a first gate line interposed portion that is arranged in the pixel adjacent region and includes an electrode layer portion formed in the electrode layer and a source line layer portion formed in the source line layer; and the electrode layer portion and the source line layer portion overlap with at least one of the first gate lines in the pixel adjacent region when viewed in a plan view; and at least either of the first gate lines is positioned between the electrode layer portion and the source line layer portion in a normal line direction of the substrate (the first configuration).

In the display device having a configuration in which the electrode includes the capacitor forming portion in the first configuration, the capacitor forming portion is formed at a position in the pixel region with a great distance between the first gate lines. Here, when the capacitor forming portions are provided with respect to predetermined ones of the first gate lines, the distance to the first gate line adjacent to the predetermined first gate line increases, which makes it possible to form the capacitor forming portion in a greater dimension in a direction orthogonal to a direction in which the predetermined first gate line extends (in the width direction). In addition, even when the capacitor forming portions are provided with respect to a plurality of the first gate lines, this makes it possible to increase a width-direction dimension of the capacitor forming portion per one first gate line, as compared with a case where electrodes are formed in the pixel adjacent region in which the distance between the first gate lines is small. As a result, large capacitors can be formed between the capacitor forming portions of the electrodes and the first gate lines. As a result, the difference between the capacitances of the first gate lines and the capacitances of the second gate lines among the gate lines can be reduced sufficiently, which makes it possible to prevent the display quality from deteriorating due to the difference between the capacitances of the first gate lines and the capacitances of the second gate lines.

In addition, in the display device having a configuration in which the electrode includes the first gate line interposed portion in the first configuration, at least one of the first gate lines is positioned between the electrode layer portion and the source line layer portion of the first gate line interposed portion. This makes the distance between at least one of the first gate lines and the electrode layer portion smaller, and makes the distance between at least one of the first gate lines and the source line layer portion smaller. As a result, large capacitors can be formed between the first gate line interposed portion of the electrode and at least one of the first gate lines, even in the pixel adjacent region where the distance between the first gate lines is small. As a result, the difference between the capacitances of the first gate lines and the capacitances of the second gate lines among the gate lines can be reduced sufficiently, which makes it possible to prevent the display quality from deteriorating due to the difference between the capacitances of the first gate lines and the capacitances of the second gate lines.

In the first configuration, the source line layer may be formed above the gate line layer, and the electrode layer may be formed below the gate line layer (the second configuration).

With the second configuration described above, the electrode layer and the source line layer can be formed to interpose the gate line layer therebetween, which makes it possible to increase the capacitances of the first gate lines with use of capacitances of the electrodes and the source lines.

In the first or second configuration, the electrode may include a capacitor forming portion, and the capacitor forming portion may include a first portion arranged at a position that overlaps with at least one of the first gate lines when viewed in a plan view, and a second portion that is connected to the first portion and is formed at a position that overlaps with at least one of the source lines when viewed in a plan view (the third configuration)

With the third configuration described above, the electrode further includes the second portion, which makes it possible to enhance the effect of increasing the capacitance of the first gate line, which is achieved by the electrode.

In the third configuration, the second portion may include a source line connection portion that is connected to at least one source line, and the source line connection portion may be formed at a position that does not overlap with the first gate lines when viewed in a plan view (the fourth configuration).

With the fourth configuration, the electrodes and the source lines can be connected easily, and the electrodes and the source lines are caused to have the same potentials, which makes it possible to still further increase capacitances of the capacitors formed between the electrodes and the source lines, as well as capacitances of the capacitors formed between the electrodes and the first gate lines.

In the fourth configuration, the capacitor forming portion may further include a connection portion that connects the source line connection portion and the first portion (the fifth configuration).

With the fifth configuration, the source line connection portion and the first portion can be connected by the connection portion, even when the source connection portion and the first portion are formed apart from each other.

In any one of the first to fifth configurations, the display device may further include transistors formed on the substrate, each electrode may include a capacitor forming portion, and at least a part of the capacitor forming portion may be arranged at a position that does not overlap with the transistors when viewed in a plan view (the sixth configuration).

With the sixth configuration, changes in properties of the transistors caused by the electrodes formed can be prevented.

In any one of the first to sixth configurations, the display device may further include a black matrix that shields light, each electrode may include a capacitor forming portion, and at least a part of the capacitor forming portion may be formed at a position that overlaps with the black matrix when viewed in a plan view (the seventh configuration).

With the seventh configuration, the aperture ratio of the pixels can be prevented from decreasing, as compared with a case where the electrodes are arranged in light passing regions (openings).

In any one of the first to seventh configurations, the display device may further include touch sensor electrodes for detecting a touch by an indicator, and touch sensor lines that are connected to the touch sensor electrodes and are formed in parallel with the source lines. Each electrode may include a capacitor forming portion. The capacitor forming portion may include a first portion arranged at a position that overlaps with at least one of the first gate lines when viewed in a plan view, and a third portion that is connected to the first portion and is arranged at a position that overlaps with the touch sensor line when viewed in a plan view (the eighth configuration)

With the eighth configuration described above, the electrode further includes the third portion, which makes it possible to enhance the effect of increasing the capacitance of the first gate line, which is achieved by the electrode.

In any one of the first to eighth configurations, the display device may further include common electrodes that are formed in a common electrode layer that is different from the gate line layer and is different from the source line layer, each electrode may include a first gate line interposed portion, and a source line layer portion of the first gate line interposed portion may include a common electrode line connected to the common electrodes (the ninth configuration).

With the ninth configuration, the common electrode line connected to the common electrodes can be used as a part of the first gate line interposed portion.

In any one of the first to ninth configurations, each electrode may include a first gate line interposed portion, and at least a part of the source line layer portion of the first gate line interposed portion may double as at least one of the source lines (the tenth configuration).

With the tenth configuration, it is possible to prevent the configuration of the display device from having complexity, as compared with a case where the source line layer portions of the first gate line interposed portions are formed separately from the source lines.

In any one of the first to tenth configurations, a width of at least one of the first gate lines in the pixel adjacent region may be set greater than a width of the second gate lines (the eleventh configuration).

With the eleventh configuration, the first gate lines have a greater width, which makes the capacitance of the first gate lines to further increase.

In the eleventh configuration, a width in the pixel adjacent region of the first gate line positioned closer to the second gate line, among the first gate lines, may be set greater than a width in the pixel adjacent region of the first gate line positioned farther from the second gate line as compared with the above-mentioned closer first gate line (the twelfth configuration).

With the twelfth configuration, also in the pixel adjacent region, which is narrow, the differences between the capacitances of the first gate lines and the capacitance of the second gate line can be reduced preferentially from the first gate line closer to the second gate line, which relatively significantly affects the display quality. As a result, the deterioration of display quality (brick-pattern display) is hardly visualized.

In the twelfth configuration, regarding a width in the pixel adjacent region of the first gate lines, the first gate line closer to the second gate line may have a greater width, and the first gate line farther from the second gate line may have a smaller width (the thirteenth configuration).

With the thirteenth configuration, also in the pixel adjacent region, which is narrow, the differences between the capacitances of the first gate lines and the capacitance of the second gate line can be reduced preferentially from the first gate line closer to the second gate line. As a result, the deterioration of display quality (brick-pattern display) is hardly visualized.

In the twelfth or thirteenth configuration, a width in the pixel adjacent region of the first gate line positioned closest to the second gate line, among the first gate lines, may be set greater than a width in the pixel adjacent region of the first gate line other than the above-mentioned first gate line positioned closest to the second gate line (the fourteenth configuration).

With the fourteenth configuration, the differences between the capacitances of the first gate lines and the capacitance of the second gate line can be reduced preferentially, regarding the first gate line that most significantly affects the display quality. As a result, the deterioration of display quality (brick-pattern display) is hardly visualized.

An active matrix substrate according to a fifteenth configuration includes: a substrate in which a notch or an aperture is formed; a plurality of gate lines formed in a gate line layer on the substrate; a plurality of source lines formed in a source line layer that is a layer different from the gate line layer, the source lines being arranged to intersect with the gate lines when viewed in a plan view; and electrodes at least a part of which are formed in an electrode layer that is a layer different from any of the gate line layer and the source line layer, wherein the gate lines include a plurality of bypass gate lines that are bent or curved to bypass the notch or the aperture; the substrate includes a bypass region through which the bypass gate lines pass for bypassing, and in which a distance between the bypass gate lines is smaller than a distance between the bypass lines in a region other than the bypass region; each electrode includes at least either of a capacitor forming portion that is arranged in the region other than the bypass region and overlaps with at least one of the bypass gate lines when viewed in a plan view, and an electrode layer portion that is formed in the electrode layer and that composes a bypass gate line interposed portion together with a source line layer portion formed in the source line layer in the bypass region; and the electrode layer portion and the source line layer portion overlap with at least one of the bypass gate lines in the bypass region when viewed in a plan view, and at least one of the bypass gate lines is positioned between the electrode layer portion and the source line layer portion in a normal line direction of the substrate (the fifteenth configuration). Incidentally, the fifteenth configuration may be applied to the first to fourteenth configuration. In addition, the fifteenth configuration can be applied to a display device.

With the fifteenth configuration, it is possible to provide an active matrix substrate in which the deterioration of display quality caused by differences in capacitances of a plurality of gate lines can be prevented.

In the fifteenth configuration, the active matrix substrate may further include a common electrode line connected to common electrodes formed in a common electrode layer that is a layer different from the gate line layer, each electrode may be arranged at a position that overlaps with the common electrode line when viewed in a plan view, and may include the capacitor forming portion (the sixteenth configuration).

With the sixteenth configuration, the electrode, together with the common electrode line, can increase a capacitance between the electrode and the bypass gate line, which makes it possible to decrease a difference between a capacitance of the bypass gate line and a capacitance of a non-bypass gate line.

In the sixteenth configuration, the common electrodes may include touch sensor electrodes for detecting a touch by an indicator, the common electrode line may include a touch sensor line that is connected to the touch sensor electrode and is formed in parallel with the source lines, and the capacitor forming portion may include a portion that overlaps with the touch sensor line when viewed in a plan view and overlaps with the bypass gate lines when viewed in a plan view (the seventeenth configuration).

With the seventeenth configuration, the electrodes, together with the touch sensor lines, can increase capacitances between the electrodes and the bypass gate lines, which makes it possible to decrease differences between capacitances of the bypass gate lines and capacitances of non-bypass gate lines.

In the seventeenth configuration, the active matrix substrate may further include lines connected at a plurality of positions to the touch sensor electrodes, wherein the capacitor forming portions may include portions that overlap with the lines when viewed in a plan view and overlap with the bypass gate lines when viewed in a plan view (the eighteenth configuration).

With the eighteenth configuration, the lines can make the capacitance distribution of the touch sensor electrodes uniform. The electrodes, together with the lines, can increase capacitances between the electrodes and the bypass gate lines, which makes it possible to decrease differences between capacitances of the bypass gate lines and capacitances of non-bypass gate lines.

In any one of the sixteenth to eighteenth configurations, the electrode may have a linear shape extending in parallel with the common electrode line, and the electrode may be connected to the common electrode line (the nineteenth configuration).

With the nineteenth configuration, a state is provided in which the electrode, in addition to the common electrode line, is electrically connected to the common electrode, which makes it possible to lower a resistance value from the common electrode to control circuits or the like.

What is claimed is:
1. An active matrix substrate comprising:
a substrate in which a notch or an aperture is formed;
a plurality of gate lines formed in a gate line layer on the substrate;
a plurality of source lines formed in a source line layer that is a layer different from the gate line layer, the source lines being arranged to intersect with the gate lines when viewed in a plan view; and
an electrode at least a part of which is formed in an electrode layer that is a layer different from any of the gate line layer and the source line layer,
wherein the gate lines include a plurality of bypass gate lines that are bent or curved to bypass the notch or the aperture,
the substrate includes a bypass region through which the bypass gate lines pass for bypassing, and in which a distance between the bypass gate lines is smaller than a distance between the bypass gate lines in a region other than the bypass region,
the electrode includes at least either of:
a capacitor forming portion that is arranged in the region other than the bypass region and overlaps with at least one of the bypass gate lines when viewed in a plan view; and
an electrode layer portion that is formed in the electrode layer and that composes a bypass gate line interposed portion together with a source line layer portion formed in the source line layer in the bypass region, and
the electrode layer portion overlaps with at least one of the bypass gate lines in the bypass region when viewed in a plan view,
the source line layer portion overlaps with the at least one of the bypass gate lines at a position in which the electrode layer portion overlaps with the at least one of the bypass gate lines when viewed in a plan view, and
the at least one of the bypass gate lines is positioned between the electrode layer portion and the source line layer portion in the position in a normal line direction of the substrate.

2. The active matrix substrate according to claim 1, wherein the source line layer is formed above the gate line layer, and
the electrode layer is formed below the gate line layer.

3. The active matrix substrate according to claim 1, wherein the electrode includes the capacitor forming portion, and
the capacitor forming portion includes a first portion arranged at a position that overlaps with at least one of the bypass gate lines when viewed in a plan view, and a second portion that is connected to the first portion and is formed at a position that overlaps with at least one of the source lines when viewed in a plan view.

4. The active matrix substrate according to claim 3, wherein the second portion includes a source line connection portion that is connected to the at least one of the source lines, and
the source line connection portion is formed at a position that does not overlap with the bypass gate lines when viewed in a plan view.

5. The active matrix substrate according to claim 4, wherein the capacitor forming portion further includes a connection portion that connects the source line connection portion and the first portion.

6. The active matrix substrate according to claim 1, further comprising a transistor that is formed on the substrate,
wherein the electrode includes the capacitor forming portion, and
at least a part of the capacitor forming portion is arranged at a position that does not overlap with the transistor when viewed in a plan view.

7. The active matrix substrate according to claim 1, further comprising a common electrode line connected to a common electrode formed in a common electrode layer that is a layer different from the gate line layer,
wherein the electrode is arranged at a position that overlaps with the common electrode line when viewed in a plan view, and
the electrode includes the capacitor forming portion.

8. The active matrix substrate according to claim 7, wherein the common electrode includes a touch sensor electrode for detecting a touch by an indicator,
the common electrode line includes a touch sensor line that is connected to the touch sensor electrode and is formed in parallel with the source lines, and
the capacitor forming portion includes a portion that overlaps with the touch sensor line when viewed in a plan view and overlaps with the bypass gate lines when viewed in a plan view.

9. The active matrix substrate according to claim 8, further comprising a line connected at a plurality of positions to the touch sensor electrode,
wherein the capacitor forming portion includes a portion that overlaps with the line when viewed in a plan view and overlaps with the bypass gate lines when viewed in a plan view.

10. The active matrix substrate according to claim 8, wherein the capacitor forming portion includes a first portion arranged at a position that overlaps with at least one of the bypass gate lines when viewed in a plan view, and a third portion that is connected to the first portion and is arranged at a position that overlaps with the touch sensor line when viewed in a plan view.

11. The active matrix substrate according to claim 7, wherein the electrode has a linear shape extending in parallel with the common electrode line, and
the electrode is connected to the common electrode line.

12. The active matrix substrate according to claim 1, further comprising a common electrode that is formed in a common electrode layer that is a layer different from the gate line layer and is different from the source line layer,
wherein the electrode includes the electrode layer portion, and
the source line layer portion in the bypass gate line interposed portion includes a common electrode line connected to the common electrode.

13. The active matrix substrate according to claim 1, wherein the electrode includes the electrode layer portion, and
at least a part of the source line layer portion of the bypass gate line interposed portion doubles as at least one of the source lines.

14. The active matrix substrate according to claim 1, wherein at least one of widths in the bypass region of the bypass gate lines is greater than a width of a non-bypass gate line that is other than the bypass gate lines among the gate lines.

15. The active matrix substrate according to claim 14, wherein a width in the bypass region of the bypass gate line positioned closer to the non-bypass gate line, among the bypass gate lines, is greater than a width in the bypass region of the bypass gate line positioned farther from the non-bypass gate line as compared with the above-mentioned closer bypass gate line.

16. The active matrix substrate according to claim 15, wherein, regarding a width in the bypass region of the bypass gate lines, the bypass gate line closer to the non-bypass gate line has a greater width, and the bypass gate line farther from the non-bypass gate line has a smaller width.

17. The active matrix substrate according to claim 15, wherein a width in the bypass region of the bypass gate line positioned closest to the non-bypass gate line, among the bypass gate lines, is greater than a width in the bypass region of the bypass gate lines other than the bypass gate line positioned closest to the non-bypass gate line.

18. A display device comprising:
an active matrix substrate; and a counter substrate that is arranged to be opposed to the active matrix substrate,
wherein the active matrix substrate includes:
a substrate in which a notch or an aperture is formed;

a plurality of gate lines formed in a gate line layer on the substrate;
a plurality of source lines formed in a source line layer that is a layer different from the gate line layer, the source lines being arranged to intersect with the gate lines when viewed in a plan view; and
an electrode at least a part of which is formed in an electrode layer that is a layer different from any of the gate line layer and the source line layer,
wherein the gate lines include a plurality of bypass gate lines that are bent or curved to bypass the notch or the aperture,
the substrate includes a bypass region through which the bypass gate lines pass for bypassing, and in which a distance between the bypass gate lines is smaller than a distance between the bypass gate lines in a region other than the bypass region,
the electrode includes at least either of:
  a capacitor forming portion that is arranged in the region other than the bypass region and overlaps with at least one of the bypass gate lines when viewed in a plan view; and
  an electrode layer portion that is formed in the electrode layer and that composes a bypass gate line interposed portion together with a source line layer portion formed in the source line layer in the bypass region, and
the electrode layer portion overlaps with at least one of the bypass gate lines in the bypass region when viewed in a plan view,
the source line layer portion overlaps with the at least one of the bypass gate lines at a position in which the electrode layer portion overlaps with the at least one of the bypass gate lines when viewed in a plan view, and
the at least one of the bypass gate lines is positioned between the electrode layer portion and the source line layer portion in the position in a normal line direction of the substrate.

19. The display device according to claim 18, further comprising a black matrix that shields light,
wherein the electrode includes the capacitor forming portion, and
at least a part of the capacitor forming portion is formed at a position that overlaps with the black matrix when viewed in a plan view.

20. A display device comprising:
a substrate in which a notch or an aperture is formed;
a plurality of gate lines formed in a gate line layer on the substrate;
a plurality of source lines formed in a source line layer that is a layer different from the gate line layer, the source lines being arranged to intersect with the gate lines when viewed in a plan view; and
an electrode at least a part of which is formed in an electrode layer that is a layer different from any of the gate line layer and the source line layer,
wherein the substrate includes a pixel region in which a pixel defined by the gate lines and the source lines is formed,
the substrate further includes a pixel adjacent region that is between the notch or the aperture on one hand and the pixel region on the other hand and is adjacent to the pixel region,
the gate lines include a plurality of first gate lines that pass through the pixel adjacent region, and a second gate line that does not pass through the pixel adjacent region,
a distance between the first gate lines in the pixel adjacent region is smaller than a distance between the first gate lines in the pixel region,
the electrode includes at least either of:
  a capacitor forming portion that is arranged in the pixel region and overlaps with at least one of the first gate lines when viewed in a plan view; and
  an electrode layer portion that is formed in the electrode layer and that composes a first gate line interposed portion together with a source line layer portion formed in the source line layer in the pixel adjacent region, and
the electrode layer portion overlaps with at least one of the first gate lines in the pixel adjacent region when viewed in a plan view,
the source line layer portion overlaps with the at least one of the bypass gate lines at a position in which the electrode layer portion overlaps with the at least one of the bypass gate lines when viewed in a plan view, and
the at least one of the first gate lines is positioned between the electrode layer portion and the source line layer portion in the position in a normal line direction of the substrate.

* * * * *